(12) United States Patent
Sturm et al.

(10) Patent No.: US 11,287,868 B1
(45) Date of Patent: Mar. 29, 2022

(54) FACILITY POWER BACKSTOPPING SYSTEM FOR POWER MONITORING AND POWER LOSS PREVENTION

(71) Applicant: Amazon Technologies, Inc., Seattle, WA (US)

(72) Inventors: David D Sturm, Kent, WA (US); Nigel McGee, Asbum, VA (US); Eamonn Delaney, Ashbourne (IE)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/930,227

(22) Filed: Jul. 15, 2020

(51) Int. Cl.
*G06F 1/30* (2006.01)
*G01R 21/133* (2006.01)

(52) U.S. Cl.
CPC ............ *G06F 1/30* (2013.01); *G01R 21/133* (2013.01)

(58) Field of Classification Search
CPC ............................... G06F 1/30; G01R 21/133
USPC ........................................................ 713/340
See application file for complete search history.

(56) References Cited

U.S. PATENT DOCUMENTS

| | | |
|---|---|---|
| 4,060,735 A | 11/1977 | Pascucci et al. |
| 5,583,440 A | 12/1996 | Bisher |
| 5,675,194 A | 10/1997 | Domigan |
| 5,745,356 A | 4/1998 | Tassitino, Jr. et al. |
| 5,770,897 A | 6/1998 | Bapat et al. |
| 6,191,500 B1 | 2/2001 | Toy |
| 6,304,006 B1 | 10/2001 | Jungreis |
| 6,433,444 B1 | 8/2002 | de Vries |
| 6,583,519 B2 | 6/2003 | Aberle et al. |
| 6,624,533 B1 | 9/2003 | Swanson et al. |
| 6,992,247 B2 | 1/2006 | Rasmussen et al. |
| 7,197,888 B2 | 4/2007 | LeClear et al. |
| 7,265,458 B2 | 9/2007 | Edelen et al. |
| 7,296,172 B2 | 11/2007 | Hsu et al. |
| 7,449,798 B2 | 11/2008 | Suzuki et al. |
| 7,459,803 B2 | 12/2008 | Mosman |
| 7,472,290 B2 | 12/2008 | Diab et al. |
| 7,478,251 B1 | 1/2009 | Diab et al. |

(Continued)

OTHER PUBLICATIONS

U.S. Appl. No. 16/042,934, filed Jul. 23, 2018, Osvaldo P. Morales, et al.

(Continued)

*Primary Examiner* — Chun Cao
(74) *Attorney, Agent, or Firm* — Robert C. Kowert; Kowert, Hood, Munyon, Rankin & Goetzel, P.C.

(57) ABSTRACT

A power monitoring and loss prevention system includes actuators installed in lower level components of a primary power system, such as tap boxes of a power busway for an aisle of a data center. The power monitoring and loss prevention system redirects high frequency sampled power flow data to one or more computing devices that determine if power flows in the primary power system are at threshold levels that are likely to cause higher-level circuit breakers of the primary power system to be tripped. If so, the power monitoring and loss prevention causes one or more of the actuators to divert discrete lower level loads that are receiving power from the primary power system to instead receive power from a reserve power system such that power flows in the primary power system that may cause the higher level breakers of the primary power system to trip are avoided.

20 Claims, 17 Drawing Sheets

(56) References Cited

U.S. PATENT DOCUMENTS

| | | | |
|---|---|---|---|
| 7,514,815 B2 | 4/2009 | Paik et al. | |
| 7,521,884 B2 | 4/2009 | Filippenko | |
| 7,566,988 B2 | 4/2009 | Heber et al. | |
| 7,560,831 B2 | 6/2009 | Whitted et al. | |
| 7,565,555 B2 | 7/2009 | Diab | |
| 7,616,432 B2 | 11/2009 | Luebke et al. | |
| 7,642,676 B2 | 1/2010 | Washington | |
| 7,661,459 B2 | 2/2010 | Wesley et al. | |
| 7,888,816 B2 | 2/2011 | Zajkowski | |
| 7,939,968 B2 | 5/2011 | Hjort et al. | |
| 7,982,338 B2 | 7/2011 | O'Leary | |
| 7,991,588 B1 | 8/2011 | Krieger | |
| 8,108,699 B2 | 1/2012 | Diab | |
| 8,173,898 B2 | 5/2012 | Rasmussen et al. | |
| 8,212,401 B2 | 7/2012 | Linkhart et al. | |
| 8,212,427 B2 | 7/2012 | Spitaels et al. | |
| 8,222,548 B2 | 7/2012 | Espeut, Jr. | |
| 8,251,785 B2 | 8/2012 | Schmitt et al. | |
| 8,294,297 B2 | 10/2012 | Linkhart et al. | |
| 8,447,569 B1 | 5/2013 | Marwah et al. | |
| 9,793,752 B1 | 10/2017 | Morales et al. | |
| 9,871,406 B1* | 1/2018 | Churnock | H02J 3/0073 |
| 10,001,825 B2 | 6/2018 | Morales et al. | |
| 10,031,570 B2 | 7/2018 | Morales et al. | |
| 2004/0201282 A1 | 10/2004 | Kado et al. | |
| 2005/0200205 A1 | 9/2005 | Winn et al. | |
| 2006/0202559 A1 | 9/2006 | Hashimoto et al. | |
| 2007/0046103 A1 | 3/2007 | Belady et al. | |
| 2007/0118772 A1 | 5/2007 | Diab | |
| 2007/0217178 A1* | 9/2007 | Johnson, Jr. | H05K 7/1457 361/826 |
| 2008/0116898 A1 | 5/2008 | Washington | |
| 2008/0120187 A1 | 5/2008 | Wesley et al. | |
| 2008/0303347 A1 | 12/2008 | Zajkowski | |
| 2009/0009001 A1 | 1/2009 | Marwali et al. | |
| 2009/0033153 A1 | 2/2009 | Linkhart et al. | |
| 2009/0314541 A1 | 12/2009 | Jones et al. | |
| 2009/0314889 A1 | 12/2009 | Baatz et al. | |
| 2010/0019574 A1 | 1/2010 | Baldassarre et al. | |
| 2010/0141039 A1 | 6/2010 | Belady et al. | |
| 2010/0235671 A9 | 9/2010 | Jain | |
| 2010/0332857 A1* | 12/2010 | Vogman | H02J 9/005 713/300 |
| 2011/0049980 A1 | 3/2011 | Paik et al. | |
| 2011/0141039 A1 | 6/2011 | Lee | |
| 2011/0187197 A1 | 8/2011 | Moth | |
| 2011/0260538 A1 | 10/2011 | Huang | |
| 2012/0000975 A1 | 1/2012 | Heath et al. | |
| 2012/0068541 A1 | 3/2012 | Anderson | |
| 2012/0109553 A1 | 5/2012 | Hancock et al. | |
| 2012/0181869 A1 | 7/2012 | Chapel et al. | |
| 2012/0303993 A1* | 11/2012 | Nishtala | G06F 1/28 713/340 |
| 2012/0331477 A1 | 12/2012 | Zeighami et al. | |
| 2014/0208129 A1* | 7/2014 | Morales | H02J 9/02 713/300 |
| 2014/0208130 A1* | 7/2014 | Morales | H02J 9/06 713/300 |
| 2015/0035358 A1* | 2/2015 | Linkhart | H02J 3/0073 307/23 |
| 2018/0329470 A1* | 11/2018 | Morales | H02J 9/06 |
| 2021/0066957 A1* | 3/2021 | Rixhon | H02J 3/46 |

OTHER PUBLICATIONS

U.S. Appl. No. 14/133,525, filed Dec. 18, 2013, Paul Andrew Churnock.
U.S. Appl. No. 12/825,198, filed Jun. 28, 2010, Osvaldo P. Morales.
U.S. Appl. No. 15/882,944, filed Jan. 29, 2018, Paul Andrew Churnock et al.
U.S. Appl. No. 15/871,817, filed Jan. 15, 2018, Paul Andrew Churnock, et al.

* cited by examiner

FACILITY POWER BACKSTOPPING SYSTEM FOR POWER MONITORING AND POWER LOSS PREVENTION

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a room of a facility includes many racks, which may include server racks, networking racks, etc. Each rack, in turn, may include many electrical devices such as rack-mounted computer systems, servers, associated computer equipment, networking devices, etc.

In some facilities, an electrical device may receive electrical power from a primary power system and an additional secondary power system that is fully redundant at all levels of the power system with the primary power system. Such a level of redundancy for the systems and components of the primary and fully-redundant secondary power system may be referred to as "2N" redundancy. For example, in a data center, electrical devices mounted in one or more racks may receive power from a primary power system and from a fully-redundant secondary power system. The secondary power system may have an uninterruptible power supply, floor power distribution unit, and rack power distribution unit that mirrors a corresponding uninterruptible power supply, floor power distribution unit, and rack power distribution unit in the primary power system. Providing full redundancy of the power systems may, however, be costly both in terms of capital costs and in terms of costs of operation and maintenance.

Alternatively, some facilities may include a back-up power system that supports multiple primary power systems. Such a level of redundancy for the systems and components supported by the primary power systems and the back-up power system may be referred to as "N+1" redundancy, where the facility includes "N" primary power systems plus an oversubscribed reserve power system that provides reserve power support to the "N" primary power systems. For example, an automatic transfer switch of any of the primary power systems may be configured to switch to the reserve power system upstream of an electrical load in response to a loss of power from the respective primary power system. However, because the back-up system is over-subscribed, a failure causing a large portion of one or multiple ones of the primary power systems to be switched to reserve power concurrently may exceed a capacity of the reserve power system to provide reserve power.

Figure 1:
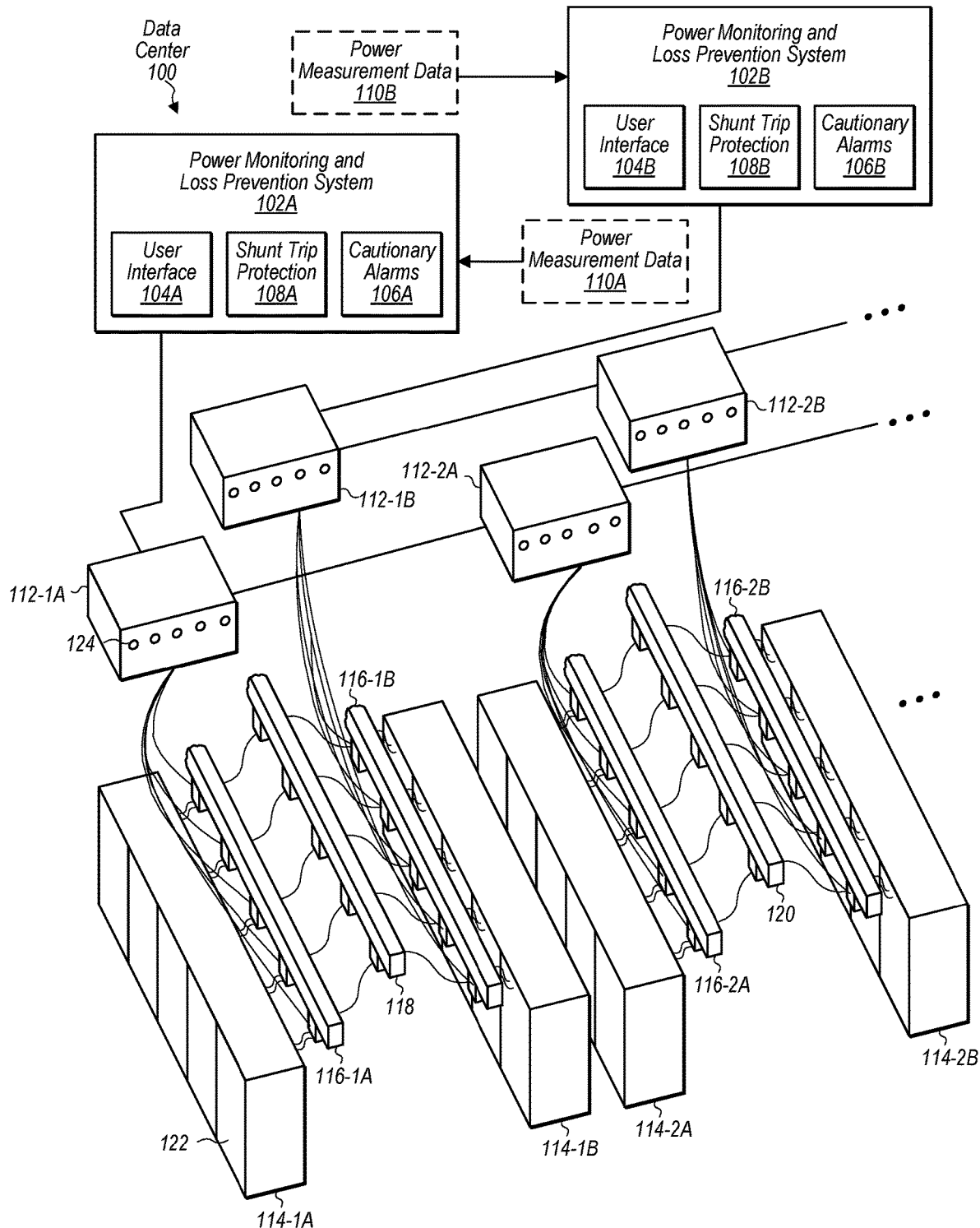
FIG. 1 illustrates a perspective view of an interior of a data center comprising rows of rack-mounted computing systems with aisles between the rows, primary and reserve power systems that supply power to the rack-mounted computing systems, and a power monitoring and loss prevention system that monitors and prevents loss of the power being supplied to the rack-mounted computing systems, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of power monitoring and loss prevention systems are disclosed. Also, power systems and facilities that include power monitoring and loss prevention systems are disclosed.

In some embodiments, a facility, such as a data center, includes a plurality of loads, such as rack-mounted computing systems, networking devices, cooling systems, etc. The facility also includes a power distribution system configured to supply power to the loads. In some embodiments, the facility may include multiple primary power distribution systems and an over-subscribed reserve power distribution system, wherein the reserve power system has sufficient capacity to supply power to one or more of the loads normally fed by the primary power systems, but has insufficient capacity to concurrently provide power to all of the loads that are normally fed by the primary power systems.

In some embodiments, a facility, such as a data center, may include numerous active power distribution systems that are arranged such that loads associated with a part of a given one of the active power distributions could transition to be provided power by another one of the number active power distribution systems that is less loaded. In such a system, the ability to transition between active power distribution systems may be used in place of a reserve power distribution system.

A power distribution system includes a first power busway configured to supply power to a first set of loads, such as a first set of racks comprising rack-mounted computing systems. Also, the power distribution system includes one or more additional power busways configured to supply power to one or more additional sets of loads, such as one or more other sets of racks comprising rack-mounted computing systems. In some embodiments, the power distribution system may include upstream power distribution components, upstream of the first and one or more additional power busways, such as a power distribution panel, uninterruptible power supply, utility transformer, generator, switchgear, upstream breakers, etc. The power distribution system also includes two or more respective power busway breakers, wherein each respective power busway breaker is associated with a respective one of the first or one or more additional power busways. For example, power supplied thorough a given one of the power busways may flow through a breaker associated with the given power busway and may be stopped in response to the breaker associated with the power busway being tripped.

Additionally, the facility, such as the data center, includes a power monitoring and loss prevention system that includes actuators configured to cause power supplied from the first or one or more additional power busways to be diverted to be fed from another source and/or prevented from being supplied from a respective one of the first or one or more additional power busways. Additionally, the power monitoring and loss prevention system includes one or more computing devices configured to determine control signals to operate the actuators. In some embodiments, respective ones of the actuators are configured to cause power being supplied to loads, such as rack-mounted computing systems in respective ones of the racks, to be diverted such that, for a given rack or a given sub-set of racks of a given one of the sets of racks associated with a given power busway, a power load associated with the given rack or the given sub-set of racks is no longer provided from the power busway configured to supply power to the given set while other ones of the racks included in the given set continue to be provided power from the power busway configured to supply power to the given set.

Also, the one or more computing devices are configured to receive power measurement data for respective ones of the first or the one or more additional power busways and determine whether a level of power flow associated with a respective one of the first or the one or more additional power busways is greater than a threshold level for the first or the one or more additional power busways, wherein the threshold level is selected such that the threshold is below a level of power flow that causes the respective power busway breaker associated with the respective one of the first or the additional power busways to trip. Additionally, the one or more computing devices are configured to cause one or more individual ones of the actuators to be actuated to divert power being supplied to one or more of the racks, such that an overall amount of power being supplied by the first or the one or more additional power busways does not exceed the respective levels of power flow that cause the respective power busway breakers to trip.

For example, in some embodiments, power flow measurements (e.g. current) may be sampled at a high-frequency and provided to a power monitoring and loss prevention system indicating real-time, or near real-time, current flow through power distribution elements of a facility, such as power busways and/or upstream components, such as power distribution panels. The power monitoring and loss prevention system may determine whether the current flows are likely to cause a breaker in the power distribution system to trip, for example based on current flows and durations of time at the respective current flows. The power monitoring and loss prevention system may, in response to determining a threshold level of current flow has been exceeded for a duration of time for a given power distribution element, select a set of one or more downstream loads that receive power from the power distribution element, that if diverted, would reduce the current flow to below the threshold. The power monitoring and loss prevention system may further issue commands/signals to cause actuators, such as shunt trip devices included in the power distribution system, to perform control actions to divert power away from being supplied to the set of one or more downstream loads from the power distribution element with the high current flow. Thus, instead of all of the loads that are supplied power from the power distribution element with the high current flow losing power if a breaker associated with the power distribution element is tripped, only a selected subset of the loads that are supplied power from the power distribution element are diverted away from receiving power from the power distribution element.

In some embodiments, a power monitoring and loss prevention system includes actuators and one or more computing devices. The actuators are configured to cause power being supplied to rack-mounted computing systems to be diverted such that, for a given rack or a given sub-set of racks, a power load associated with the given rack or the given sub-set of racks is no longer provided from a given power distribution element of a power distribution system while other racks continue to be provided power from the power distribution element of the power distribution system. The one or more computing devices are configured to receive power measurement data for the power distribution element, determine, whether a level of power flow for the power distribution element is greater than a threshold level, wherein the threshold level is selected such that the threshold is below a level of power flow that causes a breaker associated with the power distribution element to trip, and cause one or more individual ones of the actuators to be actuated to divert power being supplied to one or more of the rack-mounted computing systems to be diverted such that an overall amount of power being supplied by the power distribution element does not exceed the level of power flow that causes the breaker to trip.

In some embodiments, a non-transitory computer-readable media stores program instructions, that when executed on or across one or more computing devices, causes the one or more computing devices to receive power measurement data for a power busway, a power distribution unit, or a power distribution cabinet, determine, whether a level of power flow for the power busway, the power distribution unit, or the power distribution cabinet is greater than a threshold level, wherein the threshold level is selected such that the threshold is below a level of power flow that causes a breaker associated with the power busway, the power distribution unit, or the power distribution cabinet to trip, and cause one or more actuators to be actuated to divert power being supplied to electrical loads from the power busway, the power distribution unit, or the power distribution cabinet such that an overall amount of power being supplied by the power busway, the power distribution unit, or the power distribution cabinet does not exceed the level of power flow that causes the breaker to trip.

As used herein, a "computing device" includes any of various computer systems or components thereof. One example of a computer device is a rack-mounted server. As used herein, the term computer or computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), universal serial bus drive (USB drive), and/or a digital versatile disc (DVD) may also be used. Also, additional input channels may include computer peripherals associated with an operator interface such as a mouse, a keyboard, or other human machine interface. Alternatively, other computer peripherals may also be used that may include, for example, a scanner. Furthermore, in the some embodiments, additional output channels may include an operator interface monitor and/or a printer.

As used herein, "computer room" means a room of a building in which computer systems, such as rack-mounted servers, and/or networking devices, such as routers and switches are operated. For example, a computer room may be a room of a data center in which rack mounted computing devices are mounted in racks of the computer room.

As used herein, a "data center" includes a facility or portion of a facility in which computer operations are carried out. A data center may include servers dedicated to specific functions or serving multiple functions and/or networking devices such as routers, switches, etc. Examples of computer operations include information processing, communications, simulations, and operational control.

As used herein, "power" and/or "electrical power" mean power that can be used by one or more electrical devices, such as networking system components or computer system components. Electrical power may be stepped down in a power distribution unit or in elements downstream from the power distribution units. For example, an electrical device power supply may step down electrical power voltages (and rectify alternating current to direct current).

As used herein a "power busway" refers to a portion of a power distribution system of a facility that supplies power from a power source within the facility to multiple downstream components within the facility. For example, in some embodiments, a power busway may supply electrical power to multiple racks of a computing room, wherein the racks comprise rack mounted computing systems. In some embodiments, a power busway may include a bus bar and or power cables. In some embodiments, tap boxes may be attached to a power busway, wherein respective tap boxes provide connections to the power busway for downstream loads that receive electrical power from the power busway.

As used herein, providing power "support" refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a reserve power system may provide reserve power support to an electrical load by providing a reserve power feed that can be selectively routed to the load by an automatic transfer switch that is downstream of the reserve power system and upstream of the load, where the automatic transfer switch may selectively route the reserve power feed or a primary power feed to the load based at least in part upon one or more conditions associated with the primary power feed.

As used herein, "power distribution unit" or "floor power distribution unit" refers to a power distribution unit that can distribute electrical power to various components in a data center room. In certain embodiments, a floor power distribution unit includes a k-rated transformer.

As used herein a "power distribution cabinet" includes components that can distribute electrical power to components in a data center room, wherein the components of the power distribution cabinet are housed in an enclosure, such as a cabinet.

As used herein, "a rack power distribution unit", also referred to herein as a "rack PDU", means a device, module, component, or combination thereof, which can be used to distribute electrical power in a rack.

As used herein, "primary power" means power that can be supplied to an electrical load, for example, during normal operating conditions. A power distribution system (also referred to herein as a "power system") that distributes primary power may be referred to as a primary power system.

As used herein, "reserve power" means power that can be supplied to an electrical load upon the failure of, or as a substitute for, primary power to the load. A power distribution system (also referred to herein as a "power system") that distributes reserve power may be referred to as a reserve power system.

As used herein, "source power" includes power from any source, including but not limited to power received from a utility feed. In certain embodiments, "source power" may be received from the output of another transformer.

Some facilities may include one or more rooms, such as computing rooms. Additionally, the rooms may include a large number of electrical devices that place respective electrical loads on a power system in order to operate the electrical devices, for example the electrical devices may be computing devices or networking devices that receive electrical power form an electrical power distribution system, in some embodiments. Because a room of a facility may contain a large number of electrical devices, a large amount of electrical power may be required to operate the room of the facility. In addition, the electrical power may be distributed to a large number of locations spread throughout a room (e.g., many racks spaced from one another, and many electrical devices in each rack). Usually, a large-scale computing facility receives a power feed at a relatively high voltage. This power feed is stepped down to a lower voltage (e.g., 208V). A network of cabling, bus bars, power connectors, and power distribution units, is used to deliver the power at the lower voltage to numerous specific components in the facility, such as electrical devices in multiple rooms of the facility.

As discussed above, some facilities may utilize "2N" power systems wherein a primary power system and a fully redundant secondary power system provide power and reserve power support to electrical loads in such facilities. In such systems, both the primary power system and the secondary power system are sized to have sufficient power capacity to support the full load of the electrical devices that receive power from the "2N" power system, should either fail. For example, a primary power system and a secondary power system may each be sized to support the full load of electrical devices connected to the primary and secondary power systems by transitioning either the primary power system or the secondary power system from feeding power to the electrical devices.

In some embodiments, the reserve power system may be a shared reserve power system that provides reserve power support to multiple primary power systems (e.g. an "N+1" arrangement). In some embodiments, the reserve power system may be "oversubscribed." As used herein, "oversubscribed" refers to a condition in which total power requirements of the systems, such as electrical devices, coupled to a reserve power system exceed the capacity of the reserve power system (which includes, for example, exceeding the capacity of a sub-system such as a reserve UPS). For example, a reserve power system might have five aisles of rack systems coupled to it, but only be able to provide reserve power to one of the aisles of rack systems at any given time. In some embodiments, a reserve power system may be heavily oversubscribed (for example, subscribed at several times the capacity of the reserve power system). In certain embodiments, oversubscription is applied at a facility-wide level. For example, in some embodiments, a reserve power system may be sized to provide electrical power for a full load of a single primary power system, but may provide reserve power support for multiple primary power systems. In some embodiments, a reserve power system may be sized to provide electrical power for some (e.g. more than one) full loads of primary power systems for which it provides reserve power support, but not for all of the primary power systems for which it provides reserve power support at the same time.

In some situations, load conditions that cause a higher-level breaker to trip, such as a breaker upstream of a power busway or a breaker upstream of a power distribution panel that supplies power to multiple power busways, may cause a wide spread loss of primary power in a facility. For example, if a power busway supplies power to a row of racks, the whole row of racks may lose primary power support in response to a primary power busway breaker being tripped. Likewise, tripping of a power distribution panel main breaker upstream of a power distribution panel, may cause a loss of primary power support to racks in multiple rows that are supplied by power busways downstream of the power distribution panel. In some instances, wide spread losses of primary power support may exceed a capacity of a reserve power system to provide reserve power support. For example, a reserve power system may be configured with a capacity to supply reserve power to a row of racks in response to a loss of primary power support, but may not have sufficient capacity to supply reserve power to multiple rows of racks concurrently. Additionally, even if a reserve power system has sufficient capacity to provide power to a set of loads affected by tripping of an upstream breaker, the use of the capacity of the reserve power system to provide reserve power to the loads affected by the tripping of the upstream breaker may take away from the capacity of the reserve power system to provide reserve power to other components or loads in the facility in response to other failures or losses of primary power support.

Also, breakers sized to protect power busways, floor power distribution units, and/or power distribution cabinets, often operate based on heat, wherein a current flow exceeding a threshold value for a threshold amount of time generates enough heat sufficient to cause the breaker to trip. However, such breakers generally trip within a range of current flows that may vary. Thus, as current flows approach the threshold value, some breakers may trip at slightly lower current flows, while others may trip at slightly higher current flows, even though the breakers are all rated to trip at the same current flow level. Due to this unpredictability in regard to an exact current flow that will cause a breaker to trip, schemes that attempt to stagger breaker trip points to reduce large blast diameter losses of primary power support may be unsuccessful. This is because the repeatability of breakers tripping at precise current flow levels may be low. Likewise, human intervention to reduce power flows to avoid tripping of a power busway breaker may be lacking. For example, power flows may change at a rate such that a person cannot detect and react to the change quickly enough to avoid tripping a power busway breaker.

In some embodiments, in order to prevent losses of primary power to a large number of loads, a power monitoring and loss prevention system may monitor current flows at multiple levels of a primary power distribution system. For example, a power monitoring and loss prevention system may receive power flow measurements from power meters located in power busways, power meters located upstream of a power distribution panel, and/or power meters located at tap boxes connected to a power busway, as a few examples. Based on the received power measurements, the power monitoring and loss prevention system may be able to determine power flows (e.g. current flows) and durations of current flows at a given level that are likely to cause a breaker, such as a power busway breaker or power distribution panel main breaker to trip. In some embodiments, the power monitoring and loss prevention system may be programmed with threshold values that are slightly below the power flow levels and durations that are likely to cause the breakers in the power distribution system to trip. Based on the received power measurement data and the programmed thresholds, the power monitoring and loss prevention system may automatically cause loads receiving power from a given power busway or power distribution panel for which power flow through an associated breaker is approaching a level likely to cause the breaker to trip, to instead be diverted such that the load no longer receive power from the power busway or power distribution panel. This may reduce the current flow through the power busway or power distribution panel away from the range of power flows and durations likely to cause the associated breaker to trip. Accordingly, only a limited number of loads may be diverted from receiving power from the power busway or power distribution panel, as opposed to a large number of loads that would lose primary power support of the associated breaker were to be tripped.

In some embodiments, a power monitoring and loss prevention system includes actuators, such as shunt trip devices, that are included in downstream power components, such as components attached to the power busway for which power loads are being diverted or downstream of the power distribution panel for which power loads are being diverted. For example, shunt trip devices may be included in, or associated with, tap boxes that receive electrical power from a power busway. In some embodiments, an output cabinet of a power monitoring and loss prevention system may be mounted in an aisle and connected to multiple shunt trip devices included in multiple tap boxes associated with the aisle. The power monitoring and loss prevention system may provide control signals/instructions to the output cabinet, and based on the received instructions/signals, the output cabinet may cause respective ones of the shunt trip device actuators to be operated. For example, an output cabinet may send a signal to a shunt trip device included in a tap box, to cause the shunt trip device to open a switch or breaker included in the tap box. This control action may cause loads that receive electrical power from the power busway via the given tap box to be diverted to instead receive electrical power from a reserve power system. Also, the control action may stop the flow of electrical power to the loads from the power busway. In some embodiments, the loads may not be diverted to a reserve power system, but may instead receive power from an uninterruptible power supply, or may discontinue to receive power altogether. In some embodiments, a tap box may include multiple more than one shunt trip device, and in such embodiments a signal sent to the tap box may cause some or all of the shunt trip devices of the tap box to diver power such that the power is not provided from an associated power busway, associated with the tap box. Also in some embodiments, a single signal sent from an output cabinet may cause multiple shunt trip devices to cause power to be diverted, wherein the shunt trip devices may be included in the same tap box or in multiple different tap boxes that are commonly controlled.

FIG. 1 illustrates a perspective view of an interior of a data center comprising rows of rack-mounted computing systems with aisles between the rows, primary and reserve power systems that supply power to the rack-mounted computing systems, and a power monitoring and loss prevention system that monitors and prevents loss of the power being supplied to the rack-mounted computing systems, according to some embodiments.

In some embodiments, data center 100 includes sets of racks 122 which include rack-mounted computing devices mounted in the racks 122. In some embodiments, the racks 122 are organized into rows with aisles between the rows. For example, racks 122 are organized into rows 114-1A and 114-1B=with an aisle between the rows. The racks 124 are also organized into rows 114-2A and 114-2B with an aisle between the rows. Data center 100 also includes primary power busway 116-1A running along the row 114-1A, primary power busway 116-1B running along the row 114-1B, primary power busway 116-2A running along the row 114-2A, and primary power busway 116-2B running along the row 114-2B, wherein the primary power busways are connected to the racks and configured to supply primary power to the rack-mounted computing devices installed in the racks via tap boxes. Additionally, data center 100 includes reserve power busways 118 and 120 configured to supply reserve power support to racks in either the "A" rows or the "B" rows, or both. In FIG. 1, two sets of rows 114 with a cold aisle between the rows and a hot aisle between sets of rows is illustrated. However, in some embodiments, a computer room of a data center may include more or fewer rows of racks and aisles than illustrated in FIG. 1.

Additionally, data center 100 includes power monitoring and loss prevention systems 102A and 102B and output cabinets 112-1A, 112-1B, 112-2A, and 112-2B. The output cabinets are connected to shunt trip devices installed in positions along the primary power busways 116-1A, 116-1B, 116-2A, and 116-2B, such that the shunt trip devices when actuated cause a circuit to open such that power flow from the power busways to an associated rack or sub-set of racks of a given row is stopped. For example, in some embodiments, the shunt trip devices may be included in tap boxes attached to power busways 116-1A, 116-1B, 116-2A, and 116-2B. In such a circumstance, a power feed to the rack or sub-set of racks of the row may be diverted such that power is instead fed to the rack or sub-set of racks from one of the reserve power busways 118 or 120. In some embodiments, the "A" rows may be provided power from a first primary power system (e.g. primary power system "A") and the "B" rows may be provided power from a second primary power system (e.g. primary power system "B"). In some embodiments, an "A" primary power system and a "B" primary power system may include separate utility feeds, separate generators, separate uninterrupted power supplies (UPSs), etc. such that the "A" primary power system and the "B" primary power system are independent of one another.

In some embodiments, power monitoring and loss prevention system 102A may monitor components that are part of an "A" primary power system and power monitoring and loss prevention system 102B may monitor components that are part of a "B" primary power system. In some embodiments, a single power monitoring and loss prevention system may monitor components of multiple primary power systems such as those of both an "A" system and a "B" system. Additionally, for simplicity an "A" system and a "B" system are described herein. However, in some embodiments additional primary power systems may be monitored, e.g. a "C" system, "D" system, etc.

Note that references herein to a particular reference numeral, such as 102, 112, 114, 116, etc. may describe common features that apply to each such component having the described reference numeral. For example, unless indicated otherwise a feature described for output cabinets 112, may apply or be present in each of output cabinets 112-A1, 112-A2, 112-B1, 112-B2, etc. However, to avoid repetition, the feature may be generally described as a feature of output cabinet 112, as opposed to being repeated for each of output cabinets 112-A1, 112-A2, 112-B1, 112-B2, etc.

In some embodiments, output cabinets 112 may include indicator lights 124 that indicate that a particular shunt trip device has been actuated. In some embodiments, a signal from an output cabinet 112 may cause a shunt trip to open a circuit breaker. However manual intervention may be necessary to reset the breaker. In some embodiments, an output cabinet 112 may send a signal to an actuator to cause a circuit breaker to be opened and closed without manual intervention. In some embodiments, an output cabinet 112 may include mounting brackets configured to mount the output cabinet 112 in an overhead position in an aisle or row such that the indicator lights 126 are viewable from the aisle. Note that while indicator lights 126 are shown on a front face of the output cabinets 112 in FIG. 1, in some embodiments, indicator lights 126 may be on another surface of the output cabinets 112, such as a bottom surface that faces down towards the aisle beneath it.

Figure 4A:
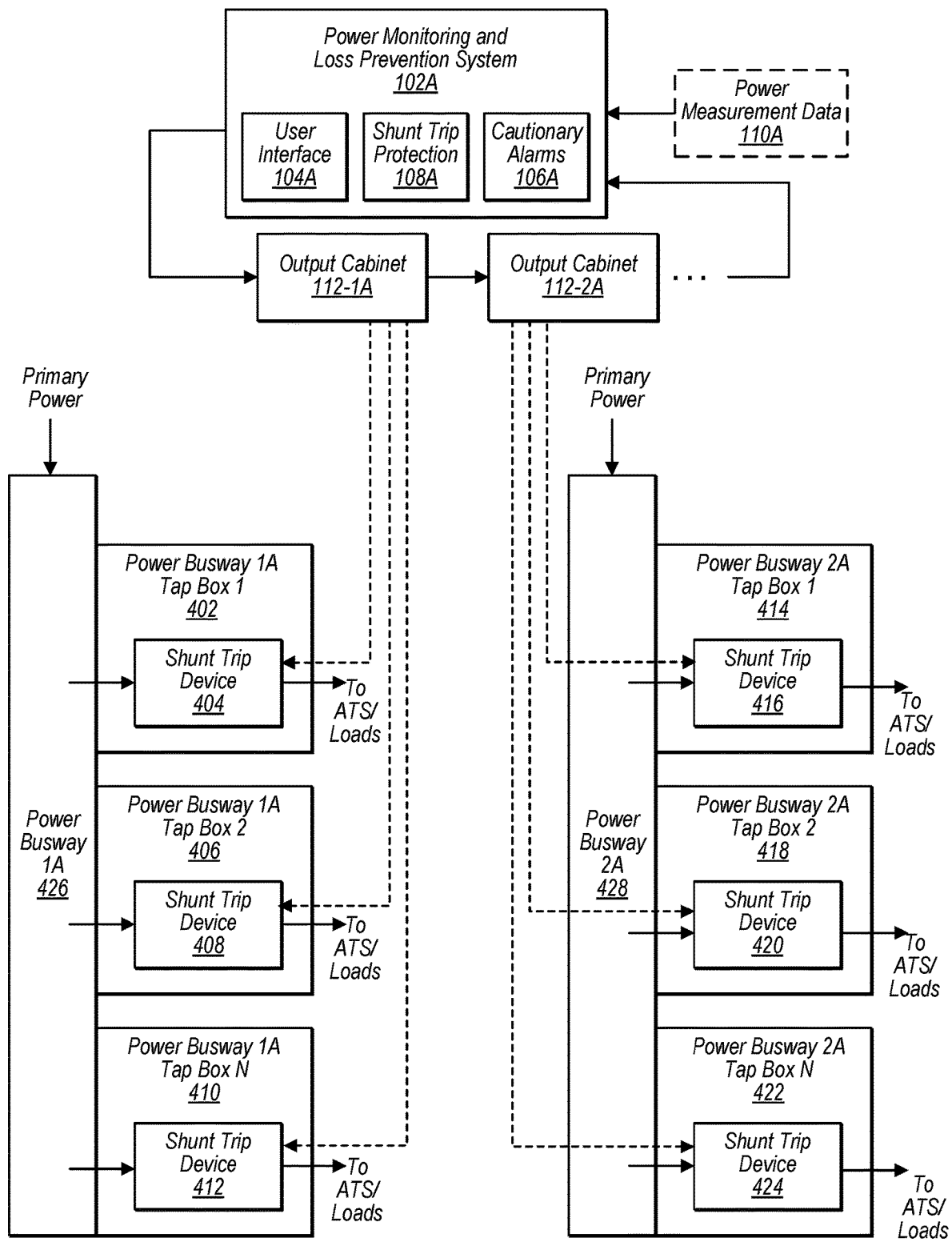
FIG. 4A is a block diagram illustrating communication paths between a power monitoring and loss prevention system and actuators included in tap boxes that supply power from power busways of a primary power system, according to some embodiments.

Power monitoring and loss prevention systems 102A and 102B that are connected to output cabinets 112-A1, 112-A2, 112-B1, 112-B2 provide control instructions/signals to the output cabinets 112-A1, 112-A2, 112-B1, 112-B2 to cause the shunt trip devices in the primary power busways 116-1A, 116-1B, 116-2A, 116-2B to be operated. A more detailed view of the power busways and shunt trip devices is shown in FIG. 4A.

In some embodiments, output cabinets, such as output cabinets 112-1A, 112-1B, 112-2A, and 112-2B illustrated in FIG. 1 may be connected in a loop such that if a first connection to the output cabinet 112, for example from the power monitoring and loss prevention system 102 is lost, a control signal from the power monitoring and loss prevention system 102 can nevertheless reach the output cabinet via a connection to an adjacent output cabinet that is also connected to the power monitoring and loss prevention system via the loop. For example if a first connection from power monitoring and loss prevention system 102A to output cabinet 112-1A were to be lost, the power monitoring and loss prevention system could still communicate with output cabinet 112-1A via a connection between output cabinet 112-1A and output cabinet 112-2A, where output cabinet 112-2A is connected to the power monitoring and loss prevention system 102A via an other end of the loop, such as shown in FIG. 4A. In some embodiments, such a loss of primary communication to an output cabinet may further trigger a communication alarm at the power monitoring and loss prevention system 102A, which can then be investigated and corrected.

In some embodiments, power monitoring and loss prevention system 102 includes a user interface 104, which may be a human machine interface, a graphical user interface, an application programmatic interface (API), a console interface, etc. In some embodiments, the user interface 104 may provide or display power measurements for system components monitored by the power monitoring and loss prevention system 102. Also, in some embodiments user interface 104 may enable an operator of the power monitoring and loss prevention system to view and/or modify alarm and trip threshold values for various components of a monitored power system. In some embodiments, one power monitoring and loss prevention system may be used to monitor multiple busways and provide output signals to multiple output cabinets. For example, in some embodiments a power monitoring and loss prevention system 102 may be implemented using a programmable logic controller (PLC) that is mounted in a computer room of a data center and monitors power flows through a power distribution system that provides power to racks included in the computer room. Also, in some embodiments, a power monitoring and loss prevention system PLC may be mounted in a room adjacent to a computer room, such as an electrical room that includes switchboards and/or other electrical equipment used to provide electrical power to the computer room.

Power monitoring and loss prevention system 102 also includes cautionary alarm module/logic 106 and shunt trip protection module/logic 108. In some embodiments, power monitoring and loss prevention system 102 receives raw power flow measurement data 110 and utilizes the raw power flow measurement data 110 to determine if a cautionary alarm threshold has been reached or if a current flow and duration meets a threshold to trigger one or more shunt trip devices to be actuated to reduce a current flow through one or more of the primary power busways. In some embodiments, the raw power measurement data 110 may be power measurement data that is sampled at a high frequency, such as at a frequency equal to or greater than one sample per 100, 200, or 500 milliseconds. The power measurement data 110 may be power measurement data collected for other systems at a data center, such as an electrical power monitoring system or a building management system, wherein the raw power flow measurement data 100 is redirected to the power monitoring and loss prevention system 102 before being provided to the electrical power monitoring system or building management system. In some embodiments, all power measurement data used by a power monitoring and loss prevention system may be raw data that is redirected to the power monitoring and loss prevention system and/or originally directed to the power monitoring and loss prevention system without being processed by an intermediate service, such as a building management system or electrical power monitoring system (e.g. the raw data may not have been averaged, etc.).

For example, an electrical power monitoring system or a building measurement system may perform statistical analysis on raw power flow measurement data, such as computing a 1 second, 5 second, 30, second, or one minute average and recording the average result. In such circumstances, the raw power measurement data 110 may be power measurement data prior to such averaging being applied. For example, average data may hide spikes in current, whereas as raw power measurement data may include the spikes (as they occurred without averaging). In some embodiments, a power monitoring and loss prevention system 102 may perform high-speed calculations to determine whether or not to cause a shunt trip device to open. For example, if power measurement data is received at a sampling rate of one sample or more per 100, 200, or 500 milliseconds, the power monitoring and loss prevention system 102 may determine whether or not to trigger a shunt trip device and cause the device to open in less than a second, for example in a few milliseconds. In this way, a power monitoring and loss prevention system 102 may be able to identify real-time or near real-time current flow conditions that exceed a threshold for a power distribution element, such as one of busways 118 or 122, and may cause a shunt trip device associated with a load receiving power from the power distribution element to open before a breaker associated with the power distribution element is caused to trip.

In some embodiments, the power monitoring and loss prevention system 102 may be programmed with power flow curves for beakers included in a power distribution system and may be configured to cause shunt trip devices to open in order to keep a power flow associated with a given breaker within the power flow curve for the given breaker.

In some embodiments, a power monitoring and loss prevention system 102 may function as a backstopping system that provides backstop protection that is in addition to mechanical or other automated current overflow protection provided by breakers included in a power distribution system. For example, a power monitoring and loss prevention system 102 may reduce current flows through power distribution elements to keep the current flows within threshold ranges. However, in addition to current overflow protection provided by a power monitoring and loss prevention system 102, the power distribution system may also include traditional breakers that provide another level of excess current flow protection. The power monitoring and loss prevention system 102 may be additive to the power distribution system and may not impede any of the safety functionality of the power distribution system, such as traditional breakers.

Figure 2B:
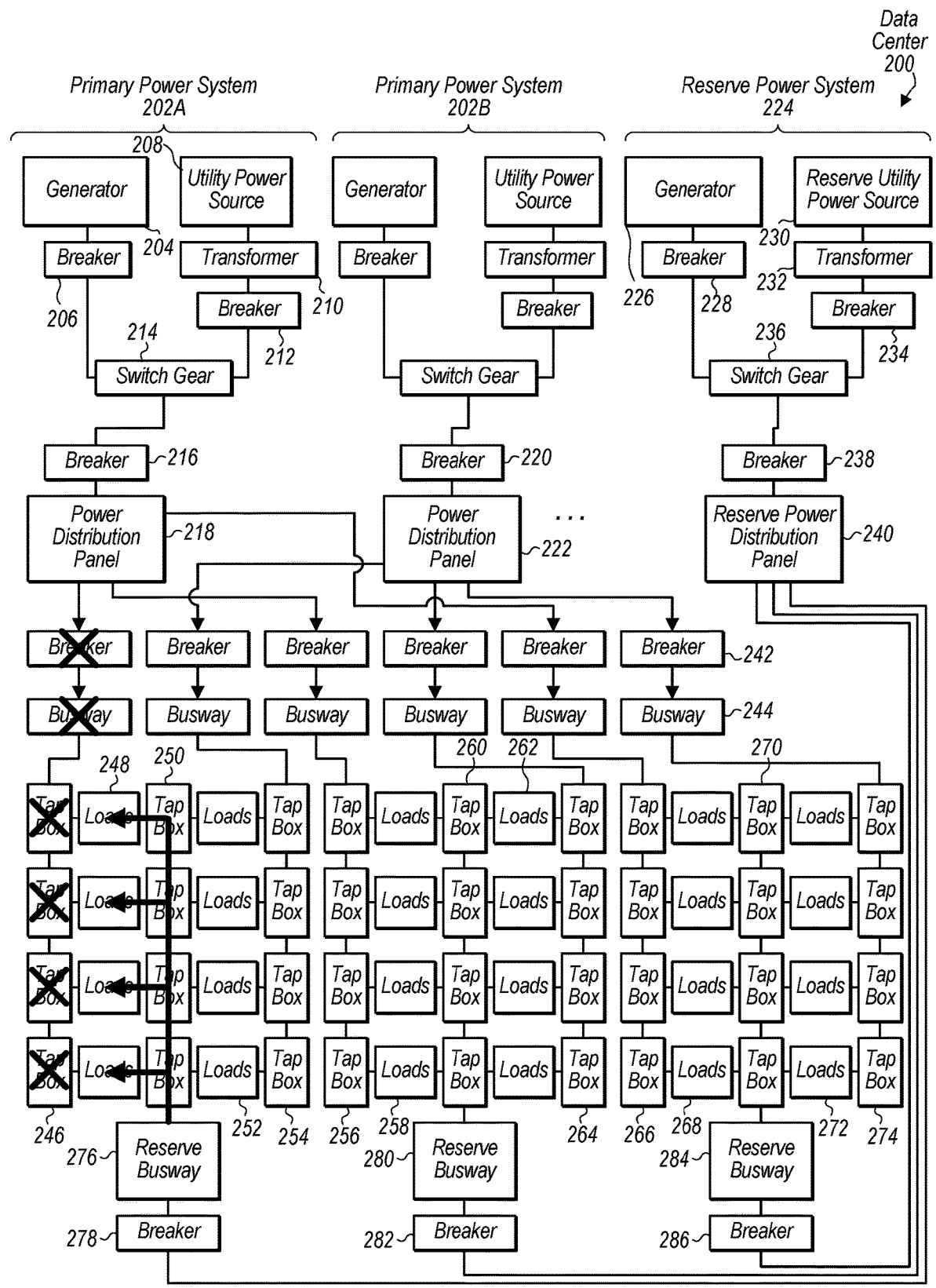
FIG. 2B is a block diagram illustrating effects of a busway breaker being tripped in a primary power system that does not include a power monitoring and loss prevention system, according to some embodiments.
Figure 2C:
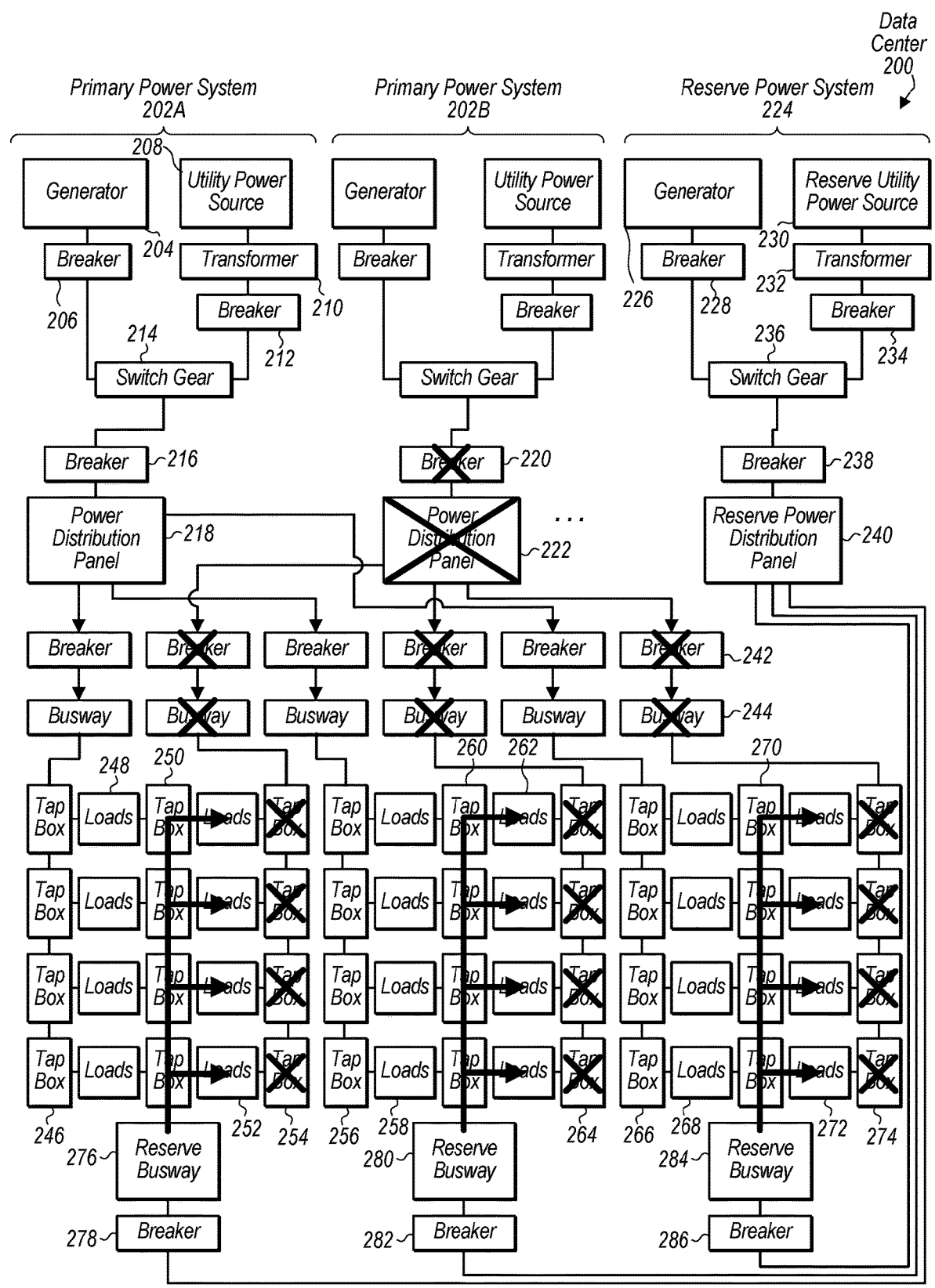
FIG. 2C is a block diagram illustrating effects of a main power distribution panel breaker being tripped in a primary power system that does not include a power monitoring and loss prevention system, according to some embodiments.
Figure 3A:
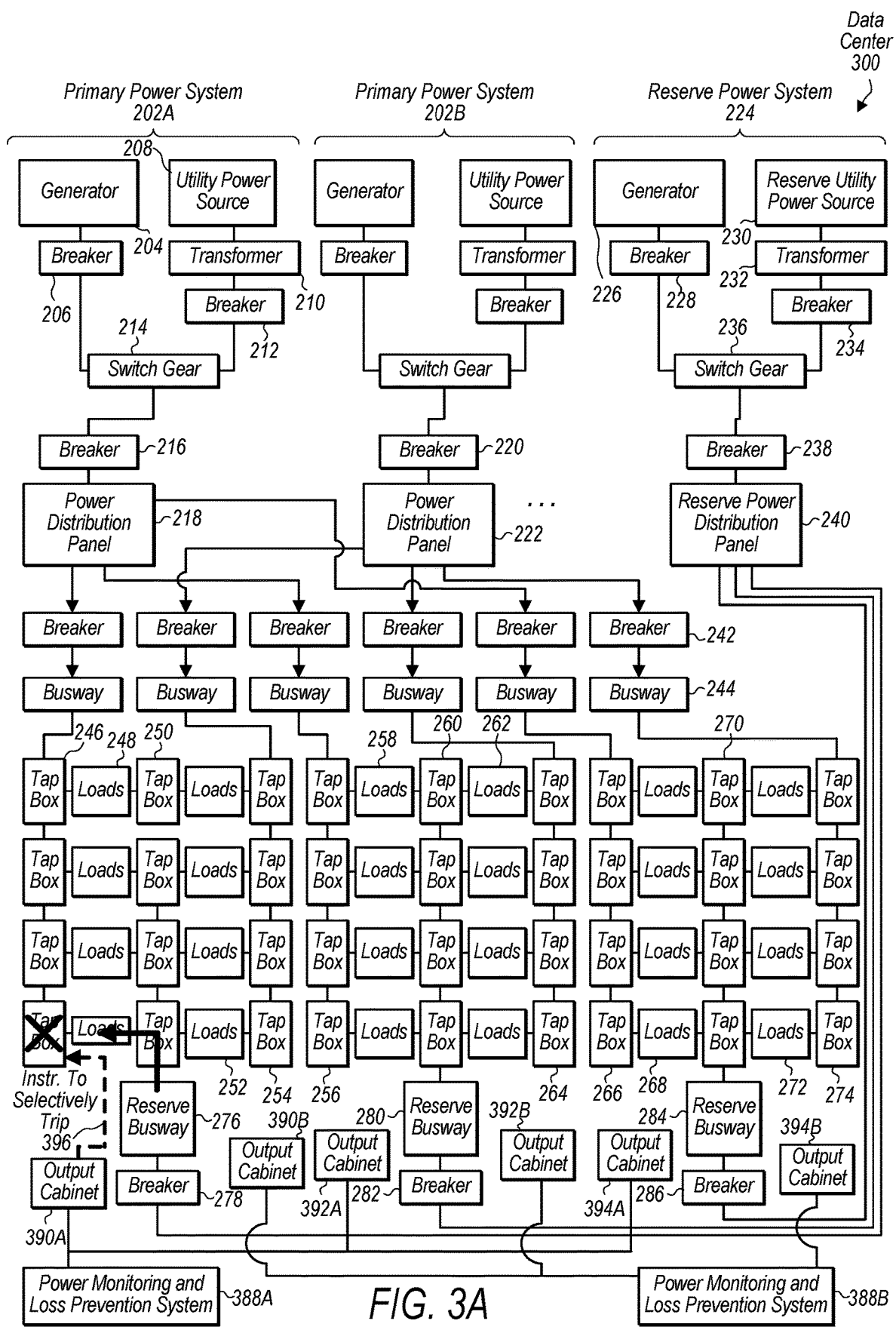
FIG. 3A is a block diagram illustrating a power monitoring and loss prevention system proactively causing a tap box actuator to divert a portion of a busway load to a reserve power system such that a busway breaker associated with the busway is not caused to trip, according to some embodiments.
Figure 3B:
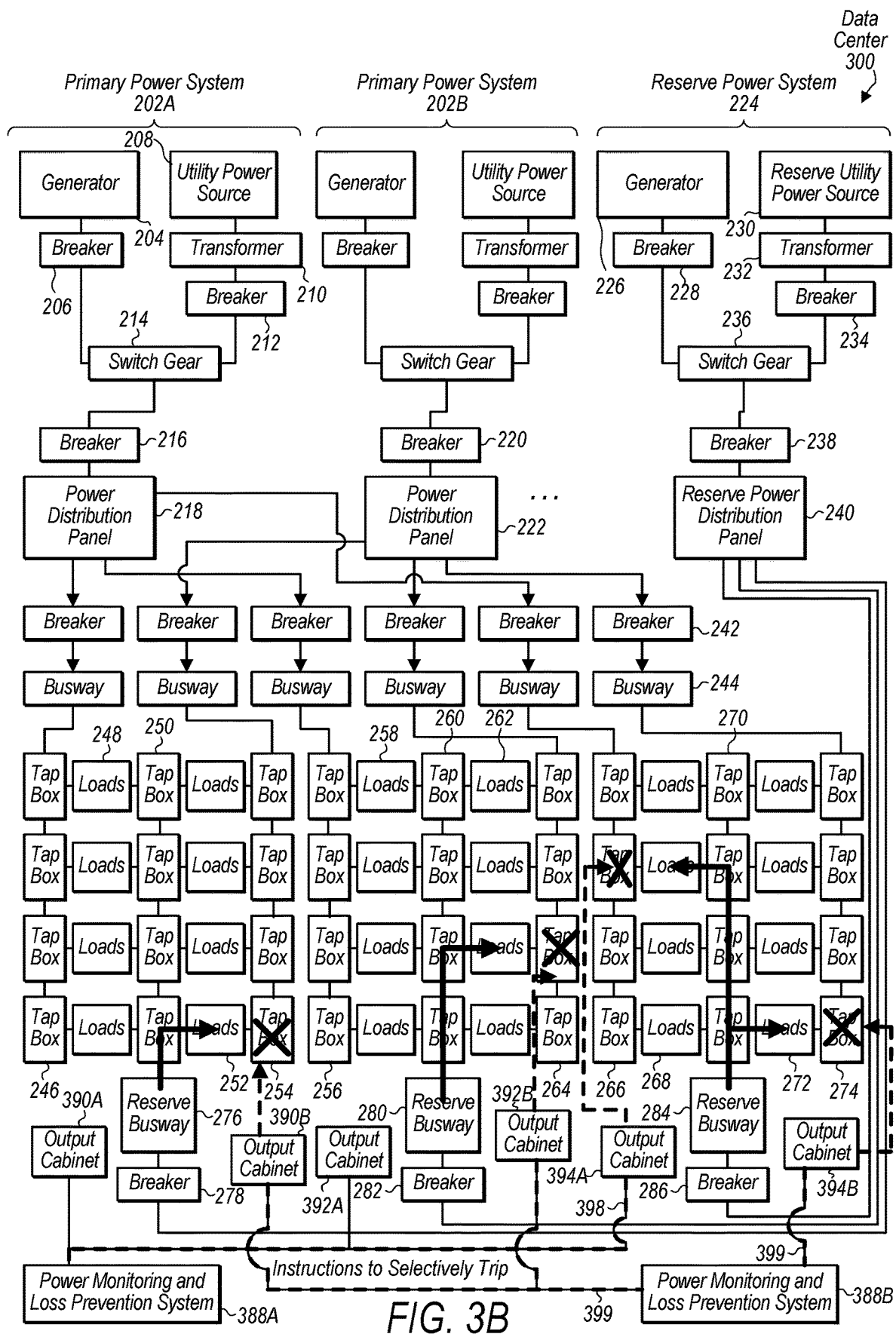
FIG. 3B is a block diagram illustrating a power monitoring and loss prevention system proactively causing a set of tap box actuators to divert portions of a main power distribution panel load to a reserve power system such that a main power distribution panel breaker associated with the power distribution panel is not caused to trip, according to some embodiments.

Power monitoring and loss prevention system 102 may reduce a blast radius of loads affected during a high current flow event. For example, a traditional breaker, when tripped, may cause all downstream loads to lose primary power. In contrast, a power monitoring and loss prevention system 102 may divert only a sub-set of downstream loads such that only a limited number of loads sufficient to reduce the current flow below the power flow curve for a given breaker/power distribution element are prevented from receiving primary power. For example, FIGS. 2B-2C illustrate an example blast radius caused by a breaker trip in a system without a power monitoring and loss prevention system and FIGS. 3A-3B show diverted loads under similar circumstances for a power distribution system that includes a power monitoring and loss prevention system, wherein fewer loads are diverted away from receiving primary power than was the case for the power distribution system that did not include the power monitoring and loss prevention system.

In some embodiments one or more computing devices may be used to implement a power monitoring and loss prevention system 102. In some embodiments, an industrial grade personal computer/human machine interface may be used to implement the user interface 104. Also, a programmable logic controller, which in some embodiments, may be a separate computing device, may be used to implement shunt trip protection 108 and cautionary alarms 106. In some embodiments, a managed Ethernet/fiber switch may be used to connect the computing device implementing the user interface to the PLC implementing the shunt trip protection 108 and/or the cautionary alarms 106. Also, in some embodiments, the power measurement data 110 may be routed to the PLC that implements the shunt trip protection 108 and the cautionary alarms 106 via the managed Ethernet/fiber switch. Additionally, in some embodiments, output commands to the output cabinets 112 may be routed via the managed Ethernet/fiber switch. In some embodiments, one or more computer systems, such as computer system 1000 illustrated in FIG. 10 may be used to implement such components of a power monitoring and loss prevention system, such as power monitoring and loss prevention system 102A or 102B.

Figure 2A:
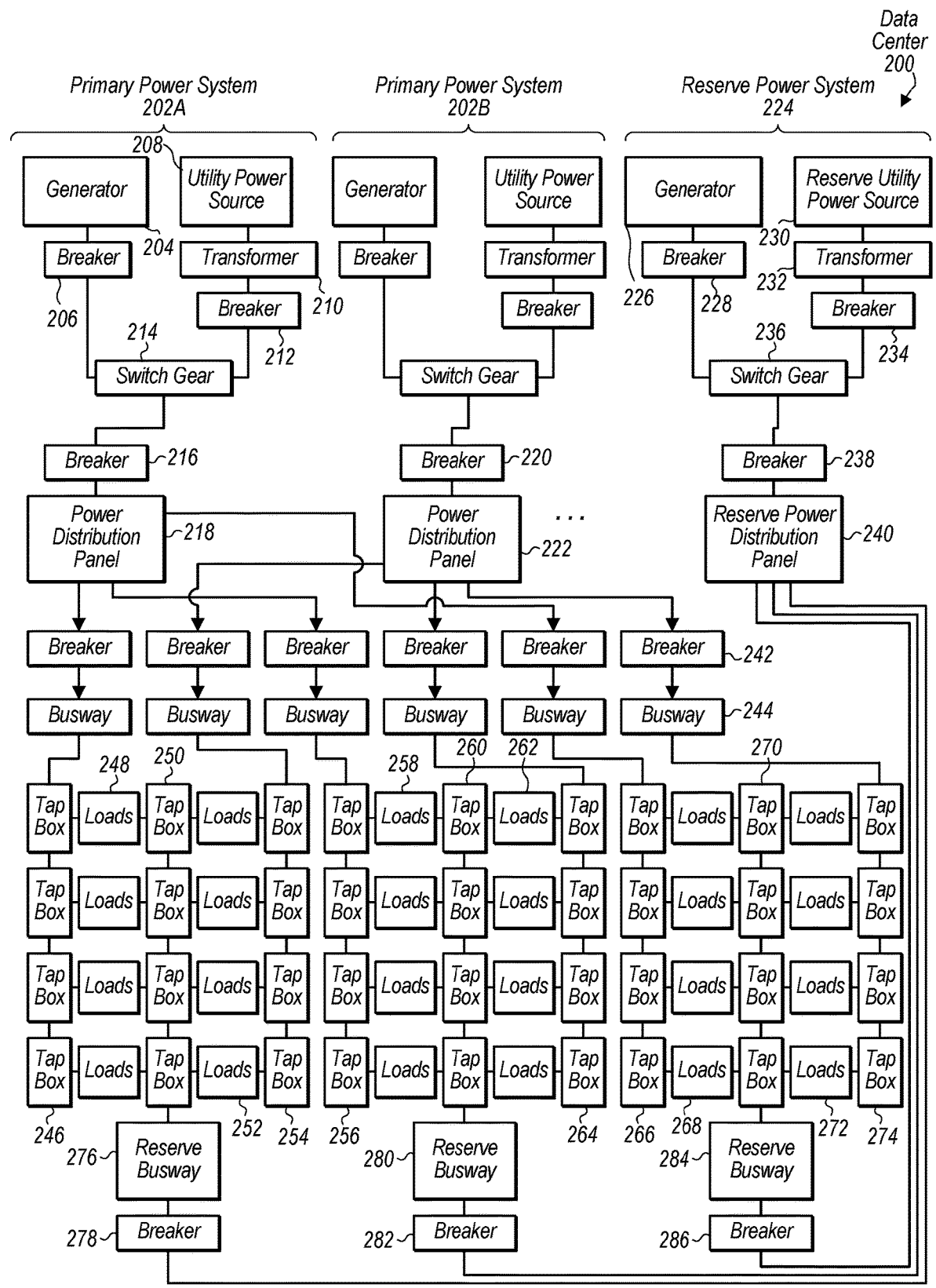
FIG. 2A is a block diagram illustrating example configurations of primary and reserve power systems, according to some embodiments.

FIG. 2A is a block diagram illustrating example configurations of primary and reserve power systems, according to some embodiments. In some embodiments, data center 100 as illustrated in FIG. 1 may include primary power systems and a reserve power system as illustrated in FIG. 2A.

Data center 200 includes primary power systems 202A and 202B, reserve power system 224, and loads 248, 252, 258, 262, 268, and 272. In some embodiments loads 248, 252, 258, 262, 268, and 272 may be rack-mounted computing systems mounted in rows of racks similar to those illustrated in FIG. 1.

In some embodiments, a primary power system, such as primary power system 202A and 202B may include a generator 204 and a connection to a utility power source 208. For example, a utility power provider may provide power to the data center site. In some embodiments, a breaker 206 may be connected downstream of generator 204. Also, in some embodiments, transformer 210 may reduce a voltage of power receive from the utility power source 208 and a downstream breaker 212 may be connected to the output of the transformer 210. A switchgear device 214 may be coupled downstream of breakers 206 and 212 and may be configured to switch a power feed supplied to downstream components of the primary power system 202 between electrical power supplied from the generator 204 and electrical power supplied from the utility power source 208. In some embodiments, primary power system 202A and primary power system 202B may receive power from different utility power sources 208, e.g. via different connections to different utility power providers. Downstream from the switchgear 214, the primary power systems 202 A and 202B may supply power to multiple line-ups, wherein each lineup comprises a power distribution panel and downstream busways that are fed from outlets of the power distribution panel. In some embodiments, each lineup may correspond to a computer room of a data center. In some embodiments, multiple computer rooms may share a common line up, or more than one line up may be used to supply power to a computer room of a data center. In some embodiments, a power distribution panel main breaker may be included in the primary power system upstream of each power distribution panel. For example, power distribution panel main breaker 216 is included upstream of power distribution panel 218 and power distribution panel main breaker 229 is included upstream of power distribution panel 222. In some embodiments, a power distribution panel breaker may be incorporated into or closely coupled with a power distribution panel. For example the breaker may be included in a common enclosure with the elements of the power distribution panel. Also, in some embodiments, the switch gear, such as switch gear 214, may also be incorporated into or closely coupled with the power distribution panel.

In some embodiments, multiple busways may receive electrical power from a given power distribution panel and each may include a busway breaker at an inlet or beginning portion of the busway. For example, sets of three busways 244 and busway breakers 242 are respectively connected downstream of power distribution panels 218 and 222. In some embodiments, breakers 242 may be included in the respective power distribution panels 218 or 222. Also in some embodiments power meters for each busway may be included in the power distribution panels adjacent to the breakers 242. Also, each busway may include multiple tap boxes that supply power from the busway to loads connected to the tap boxes, such as a rack PDU that distributes power to rack-mounted computer systems mounted in a rack. In some embodiments, a tap box outlet may be an input to an automatic transfer switch associated with a given rack or included in an automatic transfer switch cabinet proximate to a set of racks, wherein the automatic transfer switch also connected at an input to a tap box of a reserve power system, as further described below.

For example, in FIG. 2 tap boxes 246 supply power to loads 248 and tap boxes 254 supply power to loads 252, wherein loads 248 and 252 are organized into a row on either side of an aisle. Likewise tap boxes 256 provide power to loads 260 and tap boxes 264 provide power to loads 262 in an adjacent set of rows separated by an aisle. Additionally, tap boxes 266 provide power to loads 268 and tap boxes 274 provide power to loads 272 in a third set of rows separated by an aisle, as shown in FIG. 2A.

Additionally, FIG. 2A illustrates reserve power system 224 that includes a generator 226 and a reserve utility power source 230, which may be a different utility power source than the primary utility power source 208. Note that a single primary power system 202 is shown in FIG. 2A for ease of illustration. However, in some embodiments, reserve power system 224 may be oversubscribed and may provide reserve power support to multiple primary power systems 202.

Downstream from generator 226, reserve power system 224 includes breaker 228 and downstream from reserve utility source 230, reserve power system 224 includes transformer 232 and breaker 234. Switchgear device 236 is configured to switch a downstream portion of the reserve power system 224 between being fed power from generator 226 or being fed power from reserve utility power source 230. Also, reserve power system 224 includes a reserve power distribution panel 240 and associated main power distribution panel breaker 238. Reserve power distribution panel 240 provides power feeds to reserve busways 276, 280, and 284 that are protected by busway breakers 278, 282, and 286.

In some embodiments, each of reserve busways 276, 280, and 284 provide reserve power support for sets of loads supplied primary power from two primary busways. Though, in some embodiments other arrangements and ratios of primary power busways to reserve power busways may be used. Also, note that FIG. 2A illustrates an example primary power system and an example reserve power system. In some embodiments, various other components may be included in a primary power system and/or reserve power system, such as additional breakers, switch gear devices, uninterruptible power supplies, etc. In some embodiments, primary power system 202 and reserve power system 224 may supply alternating current (AC) power that is converted into direct current (DC) power via power supplies included in the racks. In some embodiments, primary power system 202 and reserve power system 224 may further include one or more rectifiers at one or more locations in the primary or reserve power systems upstream of the loads, wherein at least a portion of the primary or reserve power system distributes DC power.

FIG. 2B is a block diagram illustrating effects of a busway breaker being tripped in a primary power system that does not include a power monitoring and loss prevention system, according to some embodiments.

As discussed above, in a primary power system that does not include a power monitoring and loss prevention system, such as power monitoring and loss prevention system 102 described in FIG. 1, an upstream breaker tripping in the primary power system may cause a large blast radius of loads to lose primary power in response to the breaker tripping. For example, in FIG. 2 one of the breakers 242 that receives power from power distribution panel 218 is tripped and causes a corresponding busway to lose power, such that loads 248 that are normally provided power from that busway instead receive power from reserve power busway 276.

FIG. 2C is a block diagram illustrating effects of a main power distribution panel breaker being tripped in a primary power system that does not include a power monitoring and loss prevention system, according to some embodiments.

In a similar manner as shown in FIG. 2B, tripping an upstream power distribution panel main breaker may cause a large blast radius of loads that lose power. For example, in FIG. 2C, main power distribution panel breaker 220 is tripped, which causes all downstream loads that receive power via power distribution panel 222 to instead be switched to reserve power. In some data centers, such a large scale loss of primary power may overwhelm the reserve power system 224 and thus lead to power outages at affected loads.

However, as shown in FIGS. 3A and 3B, a power monitoring and loss prevention system may strategically trip shunt trip devices associated with individual loads to avoid tripping upstream breakers, such as a busway breaker or a power distribution panel main breaker as shown in FIGS. 2B and 2C.

FIG. 3A is a block diagram illustrating a power monitoring and loss prevention system proactively causing a tap box actuator to divert a portion of a busway load to a reserve power system such that a busway breaker associated with the busway is not caused to trip, according to some embodiments.

Data center 300 may be a similar data center as data center 100 illustrated in FIG. 1 and similar to data center 200 illustrated in FIGS. 2A-2C, but may further include a power monitoring and loss prevention system added to the data center 200. For example, data center 300 includes power monitoring and loss prevention system 388A and output cabinets 390A, 392A, and 394A and power and loss prevention system 388B and output cabinets 390B, 392B, and 394B. In some embodiments, a set of output cabinets may be installed in each aisle and may support a set of rows of racks of the aisle. In some embodiments, a first output cabinet of an aisle, such as output cabinets 390A, 392A, and 394A may be controlled by a first power monitoring and loss prevention system 388A and may control shunt trip devices in tap boxes that feed power from the primary power system 202A. Also, a second output cabinet of an aisle, such as output cabinets 390B, 392B, and 394B may be controlled by a second power monitoring and loss prevention system 388B and may control shunt trip devices in tap boxes that feed power from the primary power system 202B.

As shown in FIG. 3A in response to a high current event associated with the busway that includes tap boxes 250, power monitoring and loss prevention system 388A may instruct output cabinet 390A to generate an output signal 396 to cause a shunt trip device included in one of tap boxes 246 to open a circuit in the tap box. This may cause the load associated with the tap box, such as a rack or set of racks, to be diverted to receive electrical power from reserve busway 276. However, as can be seen in FIG. 3A, as compared to FIG. 2B, less than all the loads of the busway are diverted to receiving power from the reserve power busway 276. Thus reserve busway 276 remains available with sufficient capacity to support other power losses that may occur in relation to other ones of loads 254 or loads 248.

FIG. 3B is a block diagram illustrating a power monitoring and loss prevention system proactively causing a set of tap box actuators to divert portions of a main power distribution panel load to an alternative power source, such as reserve power system, such that a main power distribution panel breaker associated with the power distribution panel is not caused to trip, according to some embodiments.

As another example, in response to a high current event affecting power distribution panels 218 and 222, power monitoring and loss prevention systems 388A and 388B may select a set of loads to divert to reserve power such that power distribution panel main breakers 216 and 220 are not tripped. For example, power monitoring and loss prevention system 388A may provide instructions to output cabinet 394A to issue output signal 398 to a shunt trip device in one of tap boxes 266. This may reduce a power load on power distribution panel 218. Also, power monitoring and loss prevention system 388B may provide instructions to output cabinet 394B to issue output signal 399 to multiple shunt trip devices in multiple ones of tap boxes 274. However, note that even though multiple tap boxes 274 were actuated to no longer supply primary power, the whole busway was not affected. Also note that FIG. 3B only illustrates an example combination of shunt trip devices that may be actuated in response to a high current event. In some embodiments, selected shunt trip devices may be selected based on tap boxes with the greatest or least current loads. Also, in some embodiments, shunt trip devices to actuate may be selected in a way to distribute reserve power loads across multiple reserve busways. In some embodiments, other strategies for selecting shunt trip devices to actuate may be used, such as discussed in FIG. 7B.

Also, note that in some embodiments, power monitoring and loss prevention systems 388A and 388B may respectively monitor and prevent power losses for different primary power systems, such as primary power system 202A and primary power system 202B. However, a given aisle may include both an "A" system power busway and a "B" system power busway, along with a shared reserve power busway, that provides reserve power support to both the "A" system power busway and the "B" system power busway. Such an arrangement may prevent an issue with a power monitoring and loss prevention system affects both sides of an aisle that are provided reserve power support from a common reserve power busway.

In some embodiments, a primary power system, such as primary power system 202A or 202B may, during high load events, allow power flow from a utility power source and through a utility transformer to exceed a normal current flow range for the utility power source and the utility transformer. For example, the primary power system may allow a greater current flow than design to flow through transformer 210, which may have some impact on the expected useful life of the transformer, but may be very unlikely to lead to an immediate failure or loss of power for the primary power system. However, a generator of a primary power system may not be able to provide additional power beyond its rated capacity. For example, generator 204 may have a limited capacity that cannot be exceeded, which is less than a possible power flow that may flow through transformer 210. In such embodiments, wherein a current level of power flow from a utility power source exceeds a rated capacity of a generator for that power system, in response to an indication received at the power monitoring and loss prevention system that the primary power system is switching to generator, the primary power monitoring and loss prevention system may cause shunt trips in various tap boxes that supply power from the primary power system transitioning to generator to divert load to the reserve power system. This may allow remaining loads to continue to be provided power from the primary power system generator, without overloading the generator. Also, this distributes load between the primary power generator and the reserve power system. In contrast, if the primary power system utility is unavailable and the generator were to trip, all loads receiving power from the primary power system would be diverted to the reserve power system, potentially overloading the reserve power system. However, by proactively diverting only a portion of the loads to the reserve power system, the power monitoring and loss prevention system may prevent such a wide scale loss of power to the loads.

FIG. 4A is a block diagram illustrating communication paths between a power monitoring and loss prevention system and actuators included in tap boxes that supply power from power busways of a primary power system, according to some embodiments.

As shown in FIG. 4A, in some embodiments, shunt trip devices are included in tap boxes of primary power busways and are connected to an output cabinet that controls the shunt trip devices.

For example, power busway 1A (426) includes tap boxes 402, 406, and 410, which each include a respective one of shunt trip devices 404, 408, and 412. Likewise power busway 2A (428) includes tap boxes 414, 418, and 422 which each include a respective one of shunt trip devices 416, 420, and 424.

In some embodiments, output cabinet 112-1A provides a signal to respective ones of shunt trip devices 404, 408, or 412 and output cabinet 112-2A provides DC output voltages to respective ones of shunt trip devices 416, 420, or 424 to cause the shunt trip devices to actuate. In some embodiments, the output power from a tap box (if not blocked/diverted via a shunt trip device) may flow to a load, such as a rack or set of racks that include rack-mounted computer systems. Also, as discussed in FIG. 4B, in some embodiments, the output of a primary power busway tap box may be an input to an automatic transfer switch that selectively switches a power feed to be supplied to a load between a primary power feed and a reserve power feed.

Figure 4B:
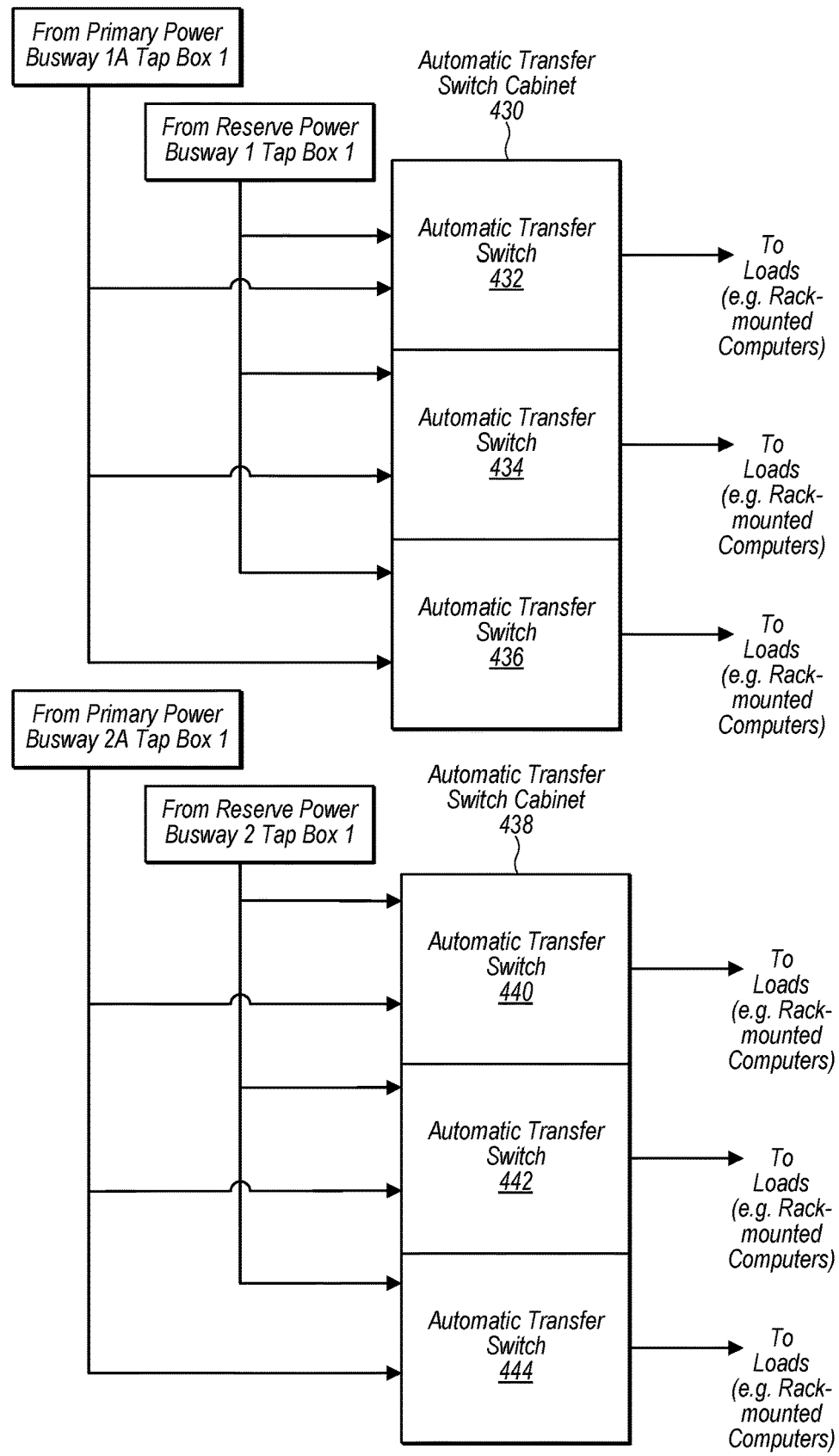
FIG. 4B is a block diagram illustrating automatic transfer switch cabinets configured to selectively supply power to downstream loads, such as rack-mounted computer systems, from either a primary power system feed or a reserve power system feed, according to some embodiments.

FIG. 4B is a block diagram illustrating automatic transfer switch cabinets configured to selectively supply power to downstream loads, such as rack-mounted computer systems, from either a primary power system feed or a reserve power system feed, according to some embodiments.

Automatic transfer switch cabinet 430 includes automatic transfer switches (ATSs) 432, 434, and 436, wherein each of the ATSs is configured to selectively switch a power feed to the downstream loads between a feed from a primary power busway tap box, such as those shown in FIG. 4A, and a feed from a reserve busway tap box, such as shown in FIGS. 2-3. In a similar manner for primary power busway 2 shown in FIG. 4A, ATS cabinet 438 includes ATSs 440, 442, and 444 configured to selectively switch a power feed to the downstream loads between a feed from a primary power busway tap box and a feed from a reserve busway tap box.

Figure 5A:
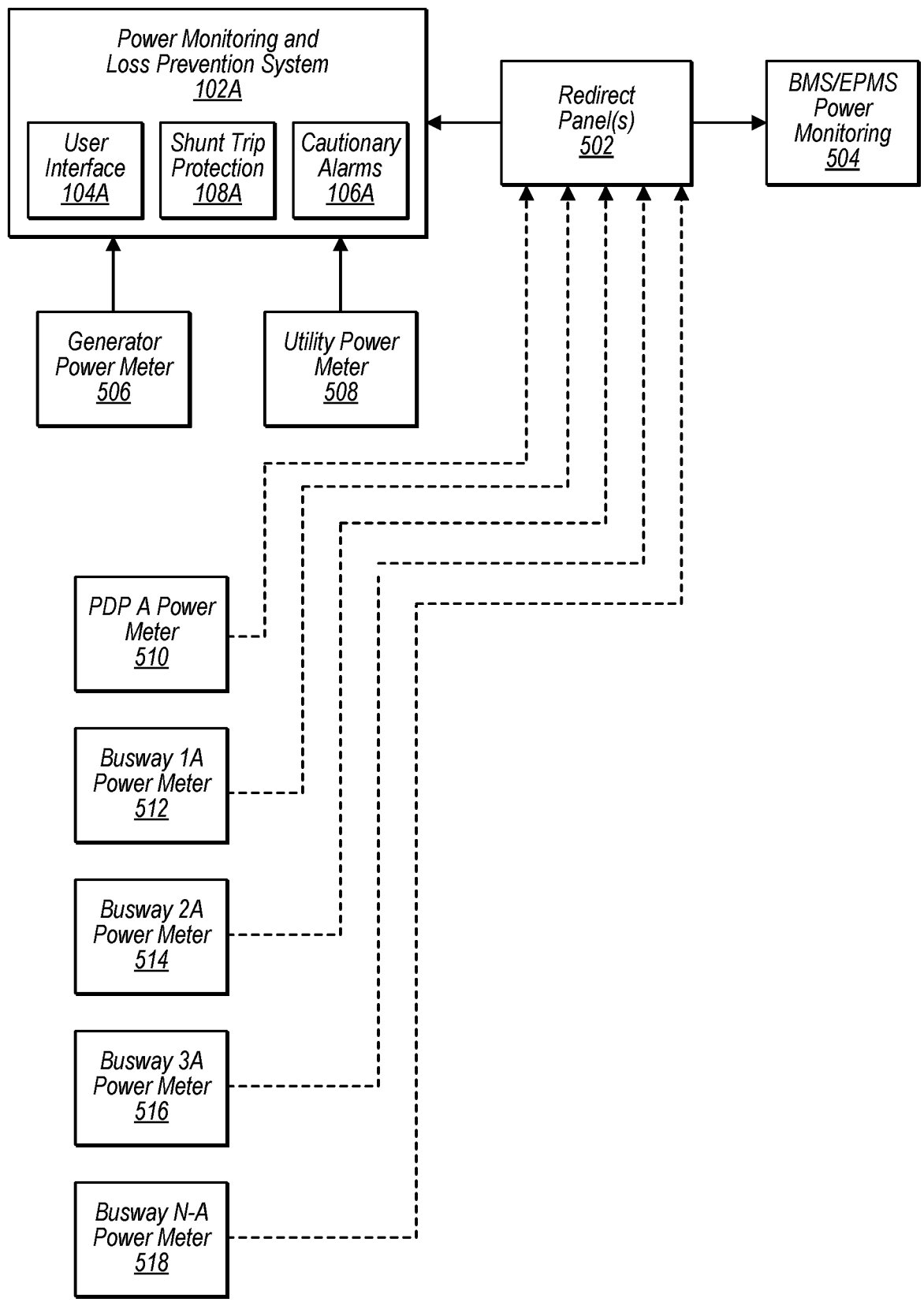
FIG. 5A is a schematic diagram illustrating power measurement signals being routed to a power monitoring and loss prevention system via a re-direct panel from various power meters included in a facility, according to some embodiments.

FIG. 5A is a schematic diagram illustrating power measurement signals being routed to a power monitoring and loss prevention system via a re-direct panel from various power meters included in a facility, according to some embodiments.

In some embodiments, power measurement data 110 supplied to power monitoring and loss prevention system 102, may be supplied from various power meters included in a facility.

For example in some embodiments, a power meter may be associated with each power distribution panel. Also, in some embodiments a power meter may be associated with each busway. Additionally, while not shown, in some embodiments, a power meter may be associated with each tap box off of a busway.

For example, in FIG. 5A redirect panel(s) 502 redirect raw power measurement signals/data from power distribution panel power meter 510 and raw power measurement signals/data from busway power meters 512, 514, 516, and 518, to power monitoring and loss prevention system 102A. Also raw power measurement signals/data from generator power meter 506 and utility power meter 508 is redirected to power monitoring and loss prevention system 102. A similar arrangement may also be provided to a power monitoring and loss prevention system for a "B" primary power system.

In some embodiments, one or more of the power meters illustrated in FIG. 5A may be an existing power meter at a facility that provide power measurements to building management system/electrical power monitoring system 504. In some embodiments, the power measurement signals/data collected by the power meters may be redirected to power monitoring and loss prevention system 102A via redirect panel 502 in addition to being provided to building management system/electrical power monitoring system 504.

Also, in some embodiments, the power measurement signals/data collected by the power meters may be provided directly to the power monitoring and loss prevention system 102A without being redirected through redirect panel(s) 502. For example, in some embodiments power measurements from generator power meter 506, utility power meter 508, and PDP A power meter 510 may be directly routed to power monitoring and loss prevention system 102 without being redirected through redirect panel(s) 502.

Figure 5B:
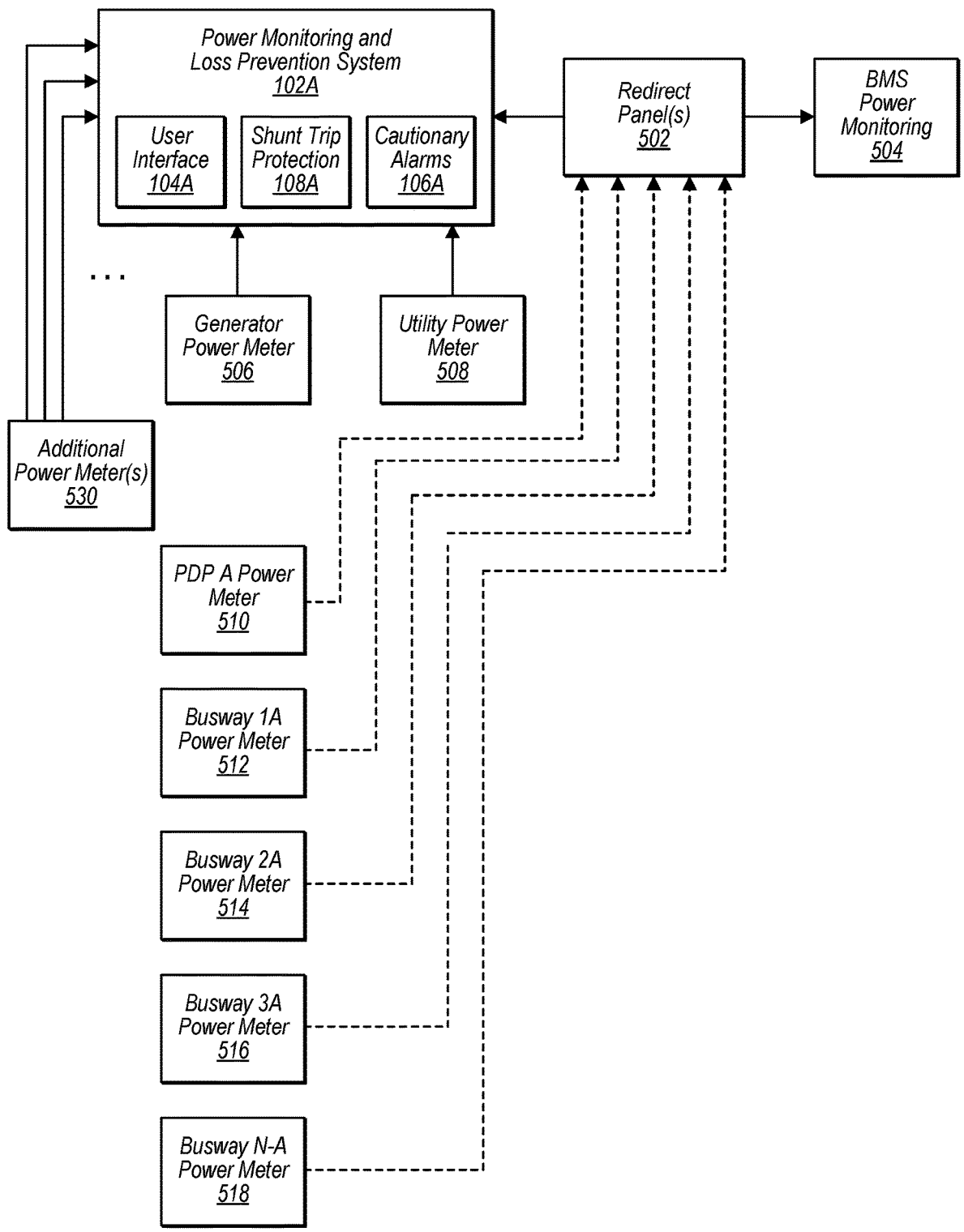
FIG. 5B is a schematic diagram illustrating power measurement signals being routed to a power monitoring and loss prevention system via a re-direct panel from various power meters included in a facility and also illustrating additional power meters that are routed directly to the power monitoring and loss prevention system without being routed through the re-direct panel, according to some embodiments.

FIG. 5B is a schematic diagram illustrating power measurement signals being routed to a power monitoring and loss prevention system via a re-direct panel from various power meters included in a facility and also illustrating additional power meters that are routed directly to the power monitoring and loss prevention system without being routed through the re-direct panel, according to some embodiments.

FIG. 5B illustrates similar components as FIG. 5A. However, in some embodiments, additional power meters 530 may be added to the facility that provide power measurement data directly to power monitoring and loss prevention system 102A without passing through redirect panel(s) 502. For example, in some embodiments, tap boxes with shunt trip devices may be installed as part of installing a power monitoring and loss prevention system and the tap boxes may include power meters that directly provide power measurement data to power monitoring and loss prevention system 102A.

Figure 5C:
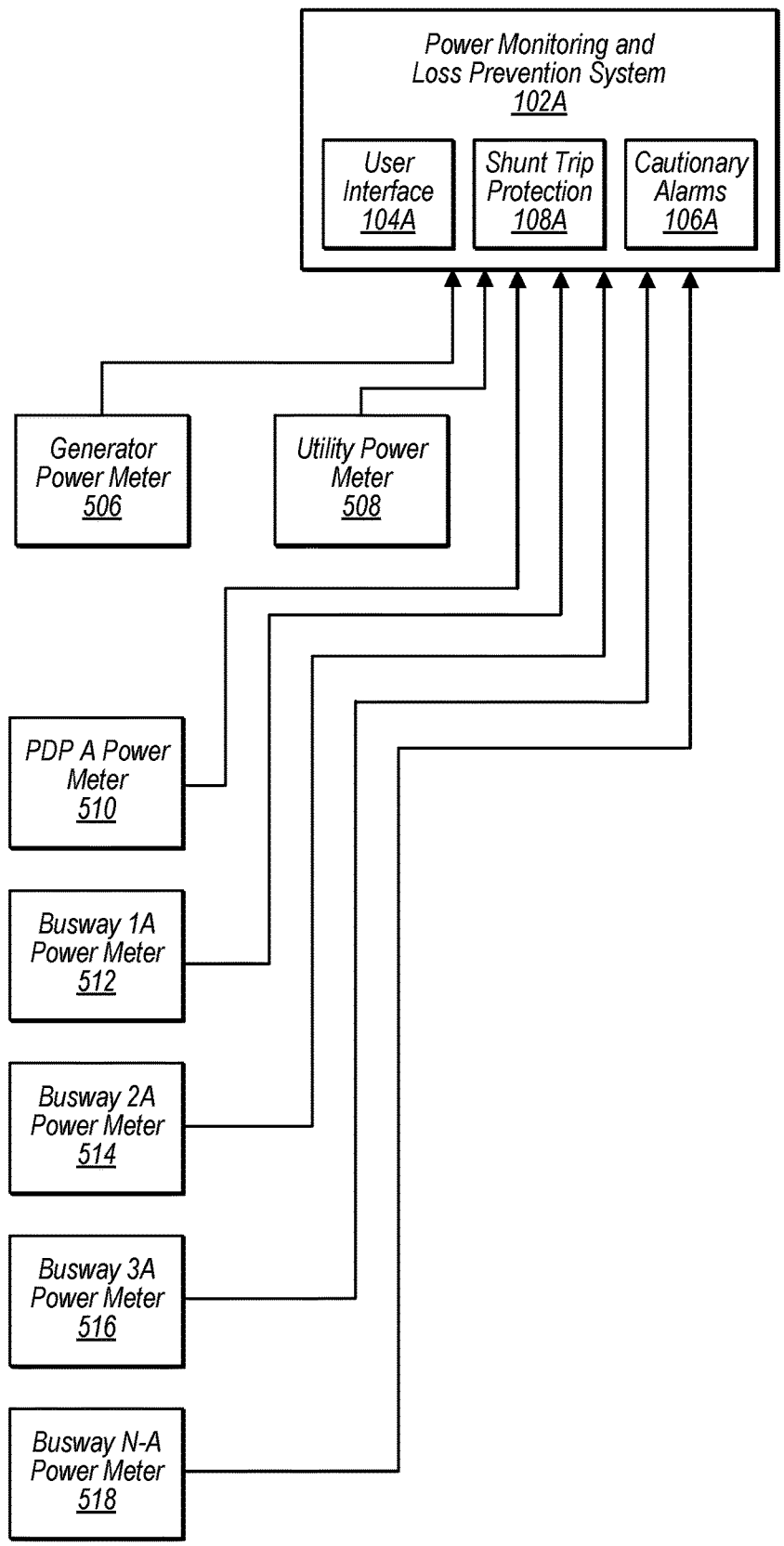
FIG. 5C is a schematic diagram illustrating power measurement signals being routed to a power monitoring and loss prevention system from various power meters included in a facility, according to some embodiments.

FIG. 5C is a schematic diagram illustrating power measurement signals being routed to a power monitoring and loss prevention system from various power meters included in a facility, according to some embodiments.

FIG. 5C illustrates similar components as FIG. 5A. However, in some embodiments, a redirect panel may not be used such that power measurement data may flow directly to power monitoring and loss prevention system 102A without passing through a redirect panel 502. For example, in some embodiments, tap boxes with shunt trip devices may be installed as part of installing a power monitoring and loss prevention system and the tap boxes may include power meters that directly provide power measurement data to power monitoring and loss prevention system 102A.

Figure 6:
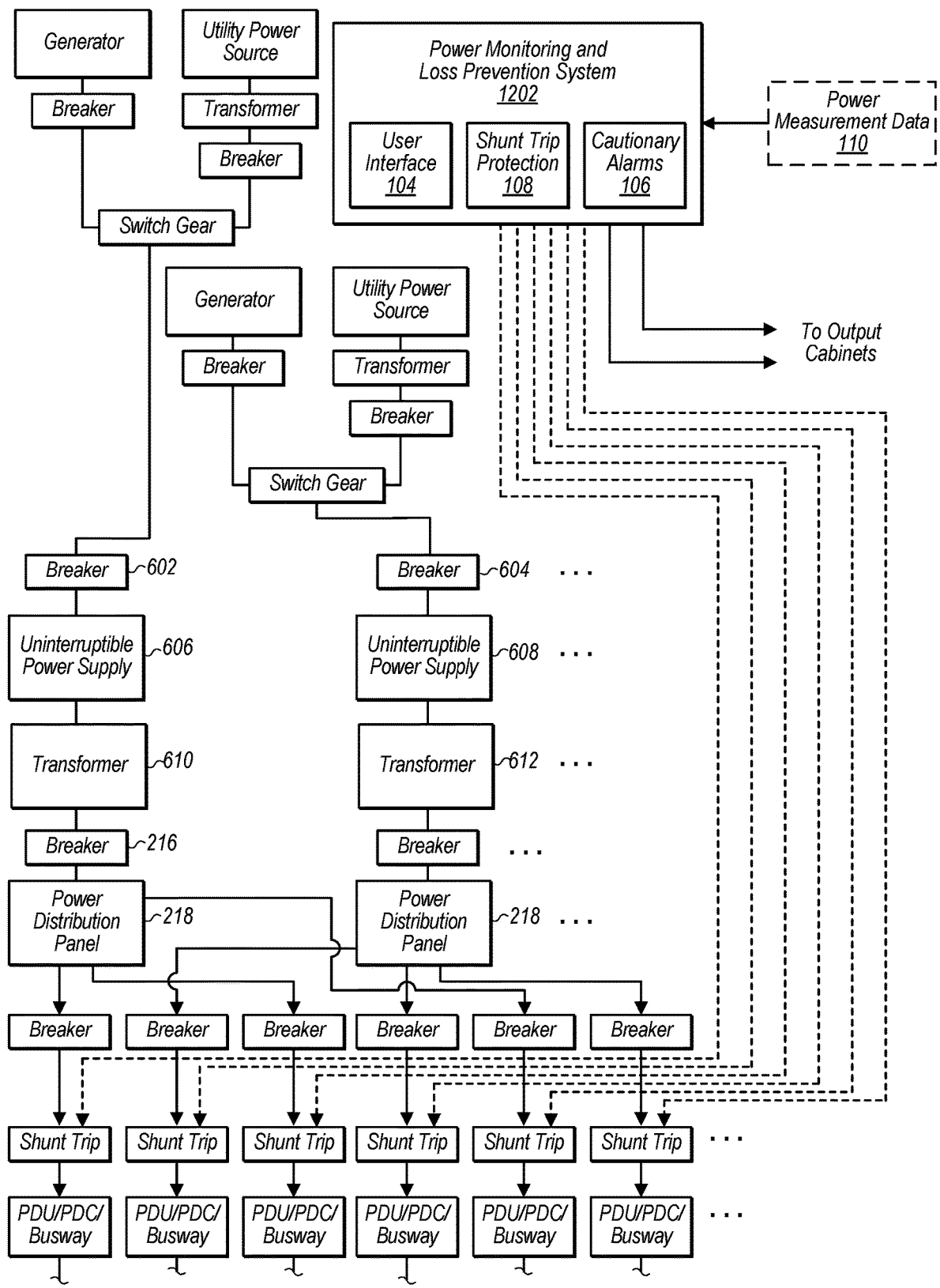
FIG. 6 is a block diagram illustrating additional components that may be included in a primary power system and additional actuators that may be included in the primary power system and controlled by a power monitoring and loss prevention system, according to some embodiments.

FIG. 6 is a block diagram illustrating additional components that may be included in a primary power system and additional actuators that may be included in the primary power system and controlled by a power monitoring and loss prevention system, according to some embodiments.

In some embodiments, a primary power system that includes a power monitoring and loss prevention system 102, may include additional or different components as those shown in FIGS. 2A-2C and 3A-3B. For example, in some embodiments, respective line ups of a primary power system may include a lineup breaker 602 or 604, a lineup uninterruptible power supply 606 or 608 and a downstream transformer 610 or 612. Also, in some embodiments, shunt trip devices may be included at a higher-level of the line-up in addition to, or instead of, being included in a tap box. For example, FIG. 6 illustrates shunt trip devices included at a busway/floor power distribution unit/power distribution cabinet level. In such embodiments, actuating the shunt trip may stop power flow to a Power Distribution Unit or ½ of Power Distribution Cabinet. Also, in some embodiments, in which a shunt trip is included at a floor power distribution unit level, actuating the shunt trip may prevent downstream loads from receiving power via the floor power distribution unit. In some embodiments, in which a shunt trip device or devices are included in a power distribution cabinet, the shunt trip device or devices, when actuated, may cause all or a portion of downstream loads to stop receiving primary power via the power distribution cabinet. In some embodiments, shunt trip device may be located in lower levels of a power distribution system and shunt trip devices selected to trip may be selected such that the lowest level shunt trip device necessary to reduce a power flow below an associated breaker trip point is selected as the shunt trip device to trip.

Figure 7A:
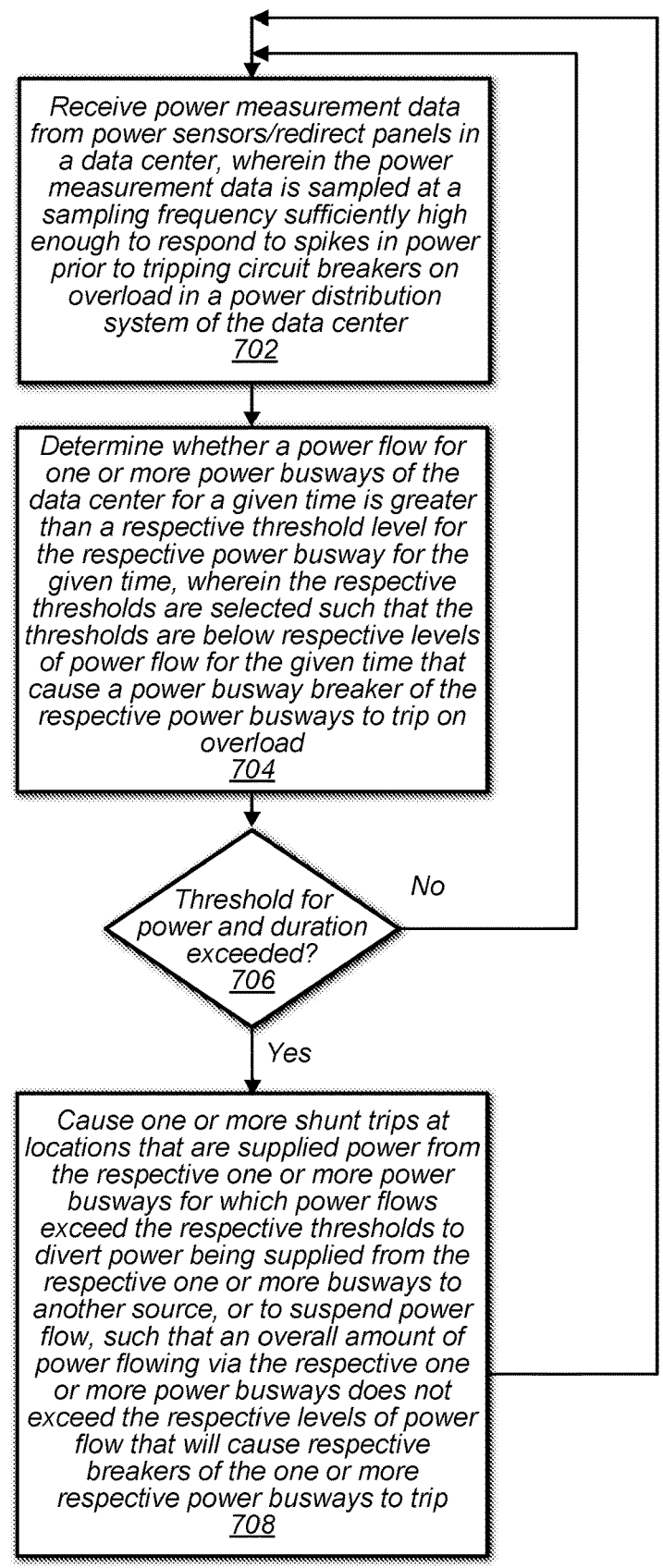
FIG. 7A is a flow diagram illustrating operations of a power monitoring and loss prevention system, according to some embodiments.

FIG. 7A is a flow diagram illustrating operations of a power monitoring and loss prevention system, according to some embodiments.

At 702, a power monitoring and loss prevention system receives power measurement signals and/or power measurement data directed to the power monitoring and loss prevention system via a redirect panel installed at the facility, a direct connection from the PDP and/or both. The power measurement data is sampled at a sampling frequency sufficiently high enough to respond to increases in power prior to tripping circuit breakers on overload in a power distribution system of the facility.

At 704, the power monitoring and loss prevention system determines whether a power flow for one or more power busways/power distribution units/power distribution cabinets, etc. of the facility for a given time is greater than a respective threshold level for the respective power busway/power distribution unit/power distribution cabinet for the given time, wherein the respective thresholds are selected such that the thresholds are below respective levels of power flow for the given time that cause a power busway/power distribution unit/power distribution cabinet breaker of the respective power busway/power distribution unit/power distribution cabinet to trip on overload.

At 706, it is determined if one or more of the power flow/current thresholds have been exceeded for a duration corresponding to the given time. For example, in some embodiments, the threshold may be a particular current value that is sustained for a particular duration, e.g. X amperes sustained for at least Y milliseconds/seconds/minutes. If the threshold is not exceeded, the process reverts to 702 and continues to monitor the power system to prevent power loss.

If one or more of the thresholds are exceeded at 706, then at 708, the power monitoring and loss prevention system causes one or more shunt trip devices to be actuated to shift one or more loads off of the primary power distribution element (e.g. power busway, power distribution unit, power distribution cabinet, remote power panel etc.) that is experiencing the high current/high power flow. The shunt trip device/devices selected to be actuated may be selected such that actuating the selected shunt trip devices causes an overall amount of power flowing via the respective one or more power distribution elements to be reduced to not exceed the respective threshold levels of power flow that will cause respective breakers of the one or more respective power distribution elements to trip.

Figure 8:
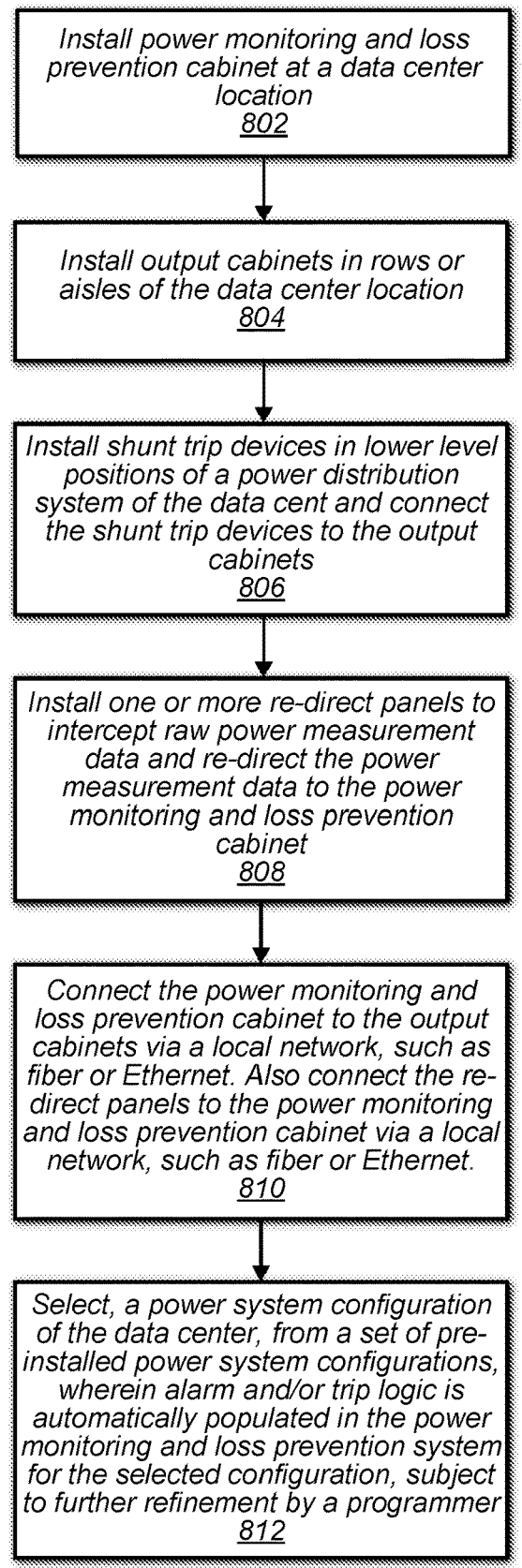
FIG. 8 is a flow diagram illustrating a process of installing and commissioning a power monitoring and loss prevention system at a facility, according to some embodiments.

In some embodiments, one or more of the alarms as described in FIG. 8 may be activated before the shunt trips area actuated at 708. For example, if the power continues to increase after activating a cautionary alarm, the power flow and duration may further trigger a shunt trip device at 708.

Figure 7B:
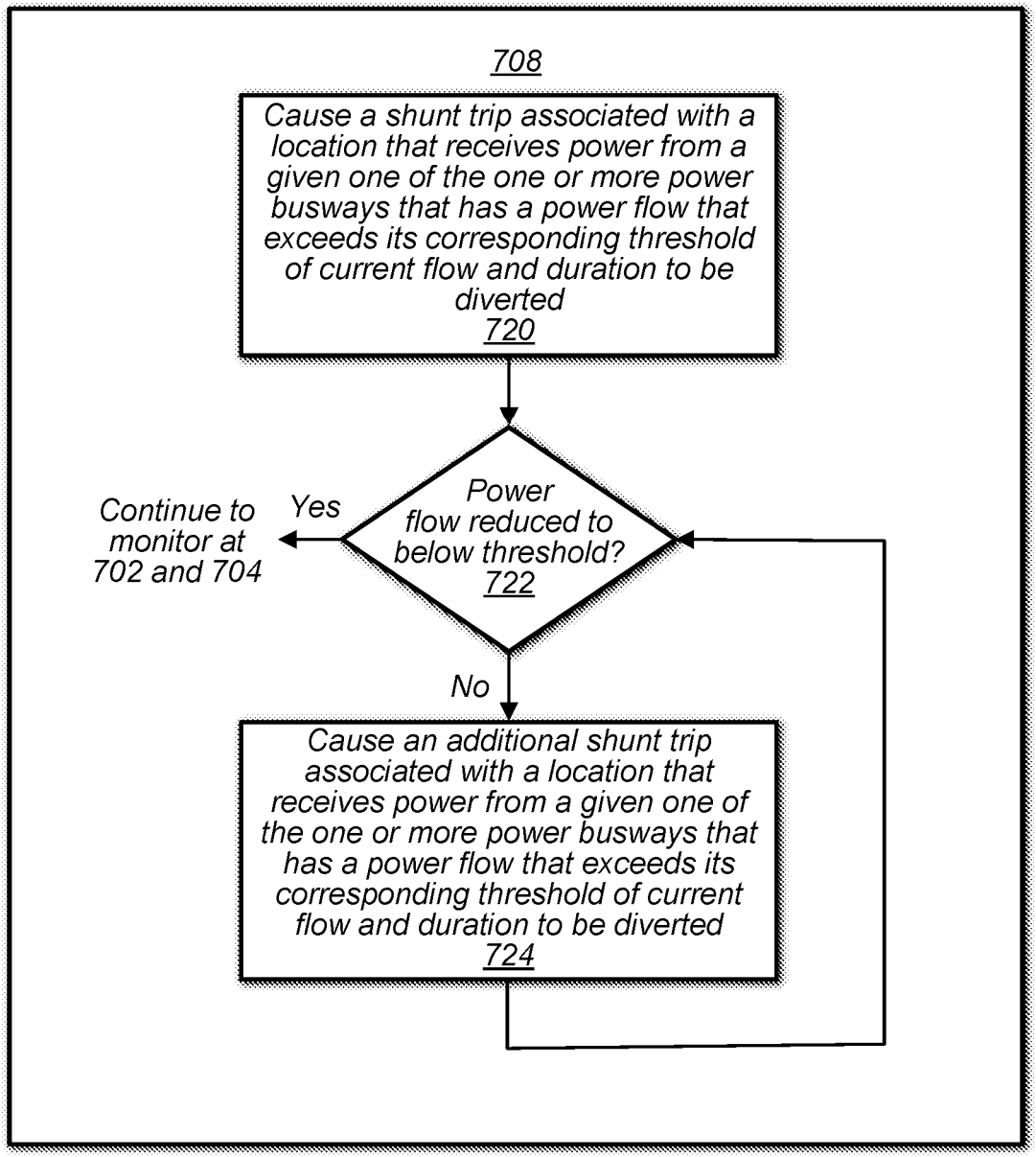
FIG. 7B is a flow diagram illustrating example operations performed by a power monitoring and loss prevention system as part of diverting loads to reduce a power flow for a power distribution element of a primary power system, according to some embodiments.

FIG. 7B is a flow diagram illustrating example operations performed by a power monitoring and loss prevention system as part of diverting loads to reduce a power flow for a power distribution element of a primary power system, according to some embodiments.

FIG. 7B provides more details as to how the shunt trip devices that are caused to be actuated at 708 of FIG. 7A may be selected.

At 720, the power monitoring and loss prevention system causes a shunt trip device associated with a first location that receives power from a power distribution element, such as a tap box of a power busway, to be actuated. In some embodiments, the shunt trip device associated with the highest current flow may be actuated. In some embodiments, the power monitoring and loss prevention system may determine an amount of power flow by which the power flow through the power distribution element needs to be reduced and may select a shunt trip device associated with a power flow slightly greater than the amount by which the power flow through the power distribution element needs to be reduced and cause the selected shunt trip device to be actuated. In some embodiments, a power monitoring and loss prevention system may actuate shunt trip devices according to a pre-determined order. For example, for a busway, the power monitoring and loss prevention system may actuate shunt trip devices included in tap boxes in an ordering of the tap boxes along the power busway. In some embodiments, addition to current flow, a duration of time at a given current flow for a given tap box may further be used to select a shunt trip device to actuate. In some embodiments, other criteria may be used to select a shunt trip device to actuate If actuating the selected shunt trip device at 722 causes the power flow for the respective power distribution element to be reduced to below the threshold, then the power monitoring and loss prevention system continues to monitor the power system at 702 and 704.

If actuating the selected shunt trip device at 722 does not cause the power flow for the respective power distribution element to be reduced to below the threshold, then the power monitoring and loss prevention system selects another shunt trip device to actuate at 724 and then determines if actuating the additional shunt trip device has reduced the power flow for the respective power distribution element to be below the threshold for a given amount of time. If so, the process reverts to 702 and 704 to continue to monitor the power system, if not the selection process continues and additional shunt trip devices are actuated until the power flow is reduced to be below the threshold.

FIG. 8 is a flow diagram illustrating a process of installing and commissioning a power monitoring and loss prevention system at a facility, according to some embodiments.

At 802, a power monitoring and loss prevention cabinet is installed at a facility, such as a data center. In some embodiments, a power monitoring and loss prevention cabinet may comprise a programmable logic controller (PLC) that implements the monitoring and control functions of the power monitoring and loss prevention system, such as cautionary alarms logic/module 106 and shunt trip protection logic/module 104. Additionally, the power monitoring and loss prevention cabinet may include a user interface 104, such as a screen, input device, keyboard, a touch screen or screen and control panels for inputting information into the power monitoring and loss prevention system, etc.

At 804, output cabinets of the power monitoring and loss prevention system are installed in rows or aisles of the facility, such as aisles between rows of racks of rack-mounted computing devices in a computer room of a data center. In some embodiments, the output cabinets may include mounting brackets for mounting the output cabinets to an overhead structure, such as a cable tray or ceiling structure.

At 806, shunt trip devices are installed in lower level positions in a power distribution system of the facility. The shunt trip devices are also connected via Ethernet or Fiber connections to the output cabinet. In some embodiments, the shunt trip devices may be pre-installed in components to be installed at the facility, such as in tap boxes that are to be mounted on a power busway at the facility. In some embodiments, the shunt trip devices may be pre-installed in components to be installed at the facility, such as pre mounted in power distribution cabinets.

At 808, one or more re-direct panels are installed at the facility. In some embodiments, installing the re-direct panels includes cutting into existing power measurement cables that provide raw power measurement data to a building management system or an electrical power monitoring system and installing a splitting device that allows the signal to continue to flow to the building management system or electrical power monitoring system, but also redirecting the signal to the power monitoring and loss prevention system.

At 810, the power monitoring and loss prevention cabinet is connected to the output boxes, for example via Ethernet or Fiber connections. Also, the re-direct panels are connected to the power monitoring and loss prevention cabinet, for example via Ethernet or Fiber connections.

At 812, a power system configuration for the facility is selected from a set of pre-installed power system configurations, wherein alarm and/or trip logic is automatically populated in the power monitoring and loss prevention system for the selected configuration, subject to further refinement by a programmer. For example, in some embodiments, the power monitoring and loss prevention system may be pre-configured with a set of typically used primary power system configurations and a user may select a primary power configuration corresponding to a primary power system configuration at the facility that the power monitoring and loss prevention system is going to be monitoring and protecting against power loss. In some embodiments, breaker power flow curves may be pre-populated into the power monitoring and loss prevention system and a user may select breaker models for breakers installed at the facility via the user interface, wherein the power monitoring and loss prevention system automatically populates alarm and shunt trip thresholds based on the breaker model input information received via the user interface. In some embodiments, a user of the power monitoring and loss prevention system may be allowed to view and acknowledge alarms. However, in some embodiments greater privileges such as of an administrator or programmer may be required to change configurations of the power monitoring and loss prevention system.

Figure 9:
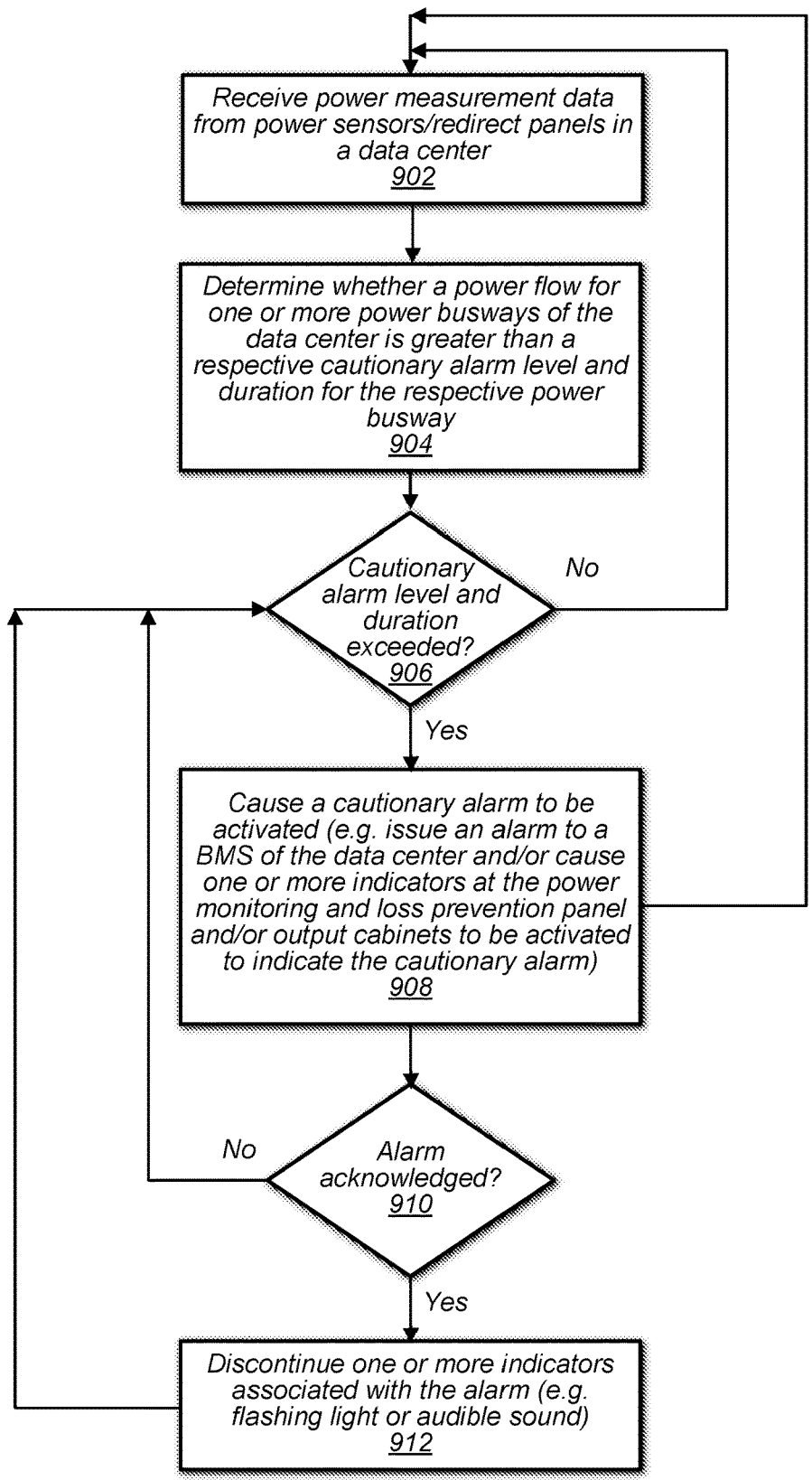
FIG. 9 is a flow diagram illustrating an example process flow for signaling a cautionary alarm that may be performed by a power monitoring and loss prevention system, according to some embodiments.

FIG. 9 is a flow diagram illustrating an example process flow for signaling a cautionary alarm that may be performed by a power monitoring and loss prevention system and may occur prior to the tripping process in FIGS. 7A and 7B, according to some embodiments.

At 902, a power monitoring and loss prevention system receives power measurement data from power meters/redirect panels in a data center.

At 904 and 906, the power monitoring and loss prevention system determines whether a power flow for one or more power distribution elements of the facility (e.g. power busway/PDU/PDC, etc.) is greater than a respective cautionary alarm level for the respective power distribution element for a given amount of time. If the cautionary alarm level is not reached, the power monitoring and loss prevention system continues to monitor the primary power systems of the facility.

At 908, if the cautionary alarm level is reached for the given amount of time, the power monitoring and loss prevention system causes a cautionary alarm to be activated. For example, the power monitoring and loss prevention system may issue an alarm to a building management system (BMS) or electrical power monitoring system (EPMS) of the data center and/or cause one or more indicators at the power monitoring and loss prevention panel and/or output cabinets to be activated to indicate the cautionary alarm.

In some embodiments, a power monitoring and loss prevention system may have multiple layers of cautionary alarms. For example, in some embodiments a first layer cautionary alarm may evaluate changes over longer periods of time, such as over several minutes. Also, a second layer cautionary alarm may evaluate changes over shorter periods of time, such as a few seconds. In some embodiments different current flow levels may be associated with the different layers of alarms. For example, a high (but not highest) current flow for the longer period may trigger the lower level alarm, but the same current flow lasting the shorter period of time may not trigger the second layer alarm. Whereas an even higher current flow lasting the shorter duration of the second layer alarm, may trigger the second layer alarm to be activated.

At 910, it is determined whether or not the cautionary alarm has been acknowledged. If so, at 912, the power monitoring and loss prevention system may discontinue one or more of the indicators activated at 908, such as a flashing light or audible sound associated with the cautionary alarm. In some embodiments, the light may remain solid inside the loss prevention system indicating that the alarm has been acknowledged, but the condition causing the alarm still exists. Once the condition causing the alarm has been resolved or corrected, the light may go out or turn to green, as an example, and the caution alarm will be deactivated.

In addition, the power monitoring and loss prevention system continues to monitor for other alarms at 906 before and after the alarm is acknowledged.

Also, in some embodiments, if the alarm condition has cleared, e.g. the current flow has been reduced to below the threshold level for the given amount of time, the alarm may be cleared and the system may revert to 902 and continue to monitor the protected primary power system.

Figure 10:
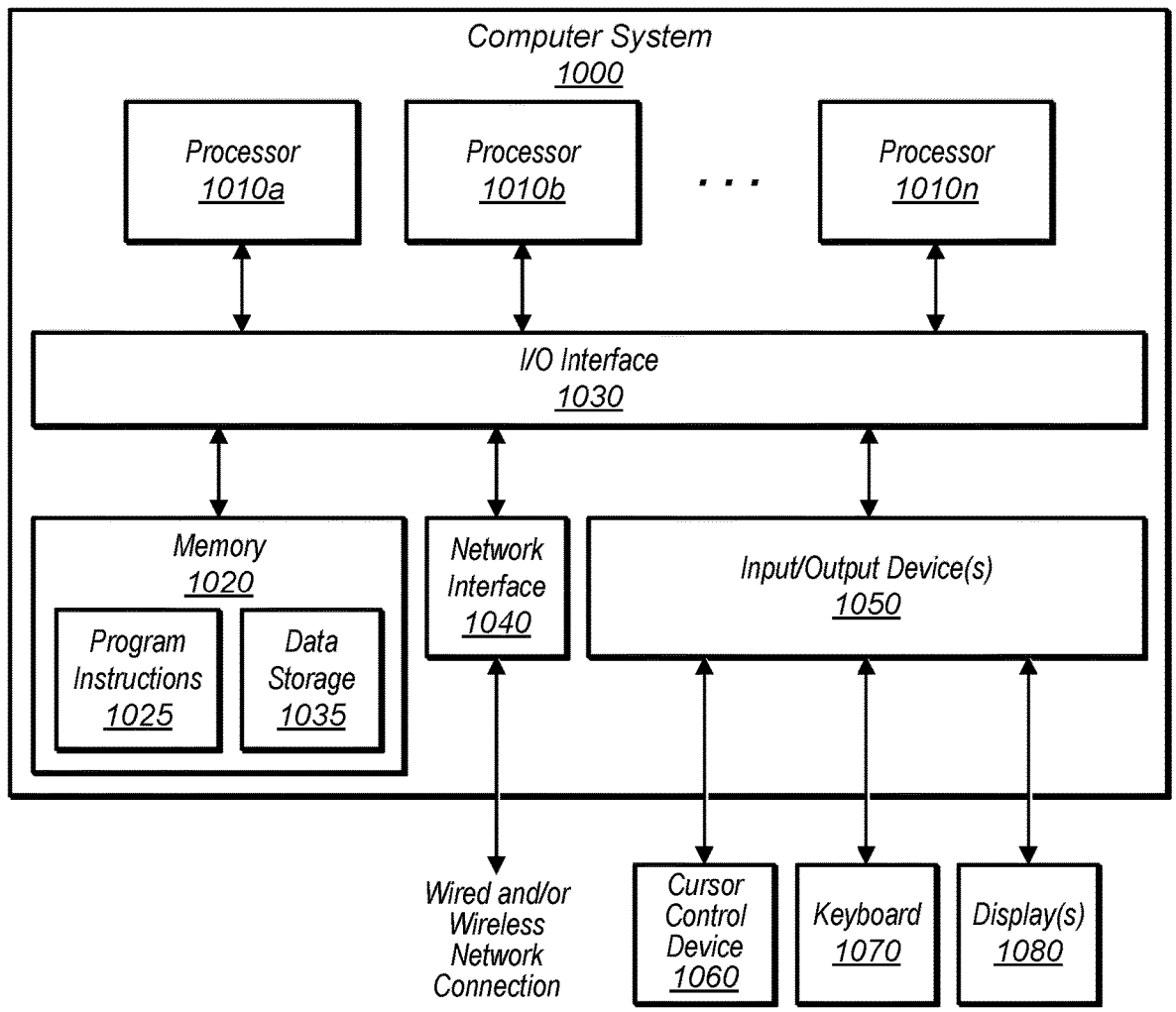
FIG. 10 is a block diagram illustrating an example computer system that implements some or all of the techniques described herein, according to some embodiments.

FIG. 10 is a block diagram illustrating an example computer system that implements some or all of the techniques described herein, according to some embodiments.

In various embodiments, the rack-mounted computer systems, the power monitoring and loss prevention system and/or a process logic controller (PLC) that implements a portion of the power monitoring and loss prevention system may each include one or more computer systems 1000 such as that illustrated in FIG. 10.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030. In some embodiments, computer system 1000 may be illustrative of servers implementing enterprise logic or a downloadable application, while in other embodiments servers may include more, fewer, or different elements than computer system 1000.

In various embodiments, computer system 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be embedded processors implementing any of a variety of instruction set architectures (ISAs), such as the x106, PowerPC, SPARC, or MIPS ISAs, or any other suitable ISA. In multiprocessor systems, each of processors 1010 may commonly, but not necessarily, implement the same ISA.

System memory 1020 may be configured to store instructions and data accessible by processor 1010. In various embodiments, system memory 1020 may be implemented using any suitable memory technology, such as static random access memory (SRAM), synchronous dynamic RAM (SDRAM), non-volatile/Flash-type memory, or any other type of memory. In the illustrated embodiment, program instructions and data implementing desired functions, such as those methods and techniques described above for the power monitoring and loss prevention system, such as in FIGS. 1-9, etc. are shown stored within system memory 1020 as program instructions 1025. In some embodiments, system memory 1020 may include data 1035 which may be configured as described herein (e.g., file objects, log objects, etc.).

In one embodiment, I/O interface 1030 may be configured to coordinate I/O traffic between processor 1010, system memory 1020 and any peripheral devices in the system, including through network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments, some or all of the functionality of I/O interface 1030, such as an interface to system memory 1020, may be incorporated directly into processor 1010.

Network interface 1040 may be configured to allow data to be exchanged between computer system 1000 and other computer systems 1000 or devices attached to a network, such as a network within a facility such as a data center, for example. In particular, network interface 1040 may be configured to allow communication between computer system 1000 and/or various I/O devices 1050. I/O devices 1050 may include scanning devices, display devices 1080, input devices (e.g. cursor control device 1060 or keyboard 1070) and/or other communication devices, as described herein, such as power meters and a user interface. Network interface 1040 may commonly support one or more wireless networking protocols (e.g., Wi-Fi/IEEE 802.11, or another wireless networking standard). However, in various embodiments, network interface 1040 may support communication via any suitable wired or wireless general data networks, such as other types of Fiber Optic or Ethernet networks, for example. Additionally, network interface 1040 may support communication via telecommunications/telephony networks such as analog voice networks or digital fiber communications networks, via storage area networks such as Fibre Channel SANs, or via any other suitable type of network and/or protocol.

In some embodiments, system memory 1020 may be one embodiment of a computer-accessible medium configured to store program instructions and data as described above. However, in other embodiments, program instructions and/or data may be received, sent or stored upon different types of computer-accessible media. Generally speaking, a computer-accessible medium may include computer-readable storage media or memory media such as magnetic or optical media, e.g., disk or DVD/CD-ROM coupled to computer system 1000 via I/O interface 1030. A computer-readable storage medium may also include any volatile or non-volatile media such as RAM (e.g. SDRAM, DDR SDRAM, RDRAM, SRAM, etc.), ROM, etc., that may be included in some embodiments of computer system 1000 as system memory 1020 or another type of memory. Further, a computer-accessible medium may include transmission media or signals such as electrical, electromagnetic, or digital signals, conveyed via a communication medium such as a network and/or a wireless link, such as may be implemented via network interface 1040.

In some embodiments, I/O devices 1050 may be relatively simple or "thin" client devices. For example, I/O devices 1050 may be configured as dumb terminals with display, data entry and communications capabilities, but otherwise little computational functionality. However, in some embodiments, I/O devices 1050 may be computer systems configured similarly to computer system 1000, including one or more processors 1010 and various other devices (though in some embodiments, a computer system 1000 implementing an I/O device 1050 may have somewhat different devices, or different classes of devices).

The various methods as illustrated in the figures and described herein represent illustrative embodiments of methods. The methods may be implemented manually, in software, in hardware, or in a combination thereof. The order of any method may be changed, and various elements may be added, reordered, combined, omitted, modified, etc. For example, in one embodiment, the methods may be implemented by a computer system that includes a processor executing program instructions stored on a computer-readable storage medium coupled to the processor. The program instructions may be configured to implement the functionality described herein (e.g., the functionality of the data transfer tool, various services, databases, devices and/or other communication devices, etc.).

Various modifications and changes may be made as would be obvious to a person skilled in the art having the benefit of this disclosure. It is intended to embrace all such modifications and changes and, accordingly, the above description to be regarded in an illustrative rather than a restrictive sense.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
a plurality of racks comprising rack-mounted computing systems;
a power distribution system configured to supply power to the rack-mounted computing systems, wherein the power distribution system comprises:
a first power busway configured to supply power to a first set of the racks;
an additional power busway configured to supply power to an other set of the racks; and
two or more respective power busway breakers, wherein each respective power busway breaker is associated with a respective one of the first or one or more additional power busways; and
a power monitoring and loss prevention system, comprising:
actuators, wherein respective ones of the actuators are configured to cause power being supplied to rack-mounted computing systems in respective ones of the racks to be diverted such that, for a given rack of a given one of the sets, a power load associated with the given rack is no longer provided from the power busway configured to supply power to the given set while other ones of the racks included in the given set continue to be provided power from the power busway configured to supply power to the given set; and
one or more computing devices configured to:
receive power measurement data for respective ones of the first or the additional power busway;
determine, whether a level of power flow associated with a respective one of the first or the additional power busway is greater than a threshold level for the first or the additional power busway, wherein the threshold level is selected such that the threshold is below a level of power flow that causes the respective power busway breaker associated with the respective one of the first or the additional power busways to trip; and cause one or more individual ones of the actuators to be actuated to divert power, of the power flow, being supplied to one or more of the racks by the respective first or the additional power busway to others of the racks being provided respective power, of the power flow, by the respective first or the additional power busway, such that an overall amount of power being supplied by the first or the additional power busway does not exceed the respective levels of power flow that cause the respective power busway breakers to trip.

2. The data center of claim 1, further comprising:

meters configured to measure respective power flows for the first and the additional power busway and provide measured power flow data to the one or more computing devices of the power monitoring and loss prevention system; or panels configured to re-direct power measurement data for the first and the additional power busway such that the re-directed power measurement data is provided to the one or more computing devices of the power monitoring and loss prevention system.

3. The data center of claim 2, wherein the measured power flow data or the redirected power measurement data is sampled at a rate greater than one sample per every 500 milliseconds.

4. The data center of claim 1, further comprising:

a reserve or secondary power distribution system, wherein the reserve or secondary power distribution system is configured to supply power to the given rack or the given sub-set of racks for which power is diverted by one or more of the actuators.

5. The data center of claim 1, wherein the power distribution system comprises:
a power distribution panel upstream of the first and the additional power busway, wherein the first and the additional power busway are provided power via the power distribution panel; and
a power distribution panel breaker, upstream of the power distribution panel; and wherein the one or more computing devices of the power monitoring and loss prevention system are further configured to:
determine, whether a level of power flow associated with the power distribution panel breaker is greater than a threshold level for the power distribution panel breaker, wherein the threshold level is selected such that the threshold is below a level of power flow that causes the power distribution panel breaker to trip; and
cause one or more individual ones of the actuators to be actuated to divert power being supplied to one or more of the racks, such that an overall amount of power being supplied by the power distribution panel does not cause the power distribution panel breaker to trip.

6. A power monitoring and loss prevention system comprising:

actuators configured to cause power being supplied to rack-mounted computing systems to be diverted such that for a given rack or a given sub-set of racks a power load associated with the given rack or the given sub-set of racks is no longer provided from a power distribution element while other racks continue to be provided power from the power distribution element; and one or more computing devices configured to:
receive power measurement data for the power distribution element;
determine, whether a level of power flow for the power distribution element is greater than a threshold, wherein the threshold is selected such that the threshold is below a level of power flow that causes a breaker associated with the power distribution element to trip; and
cause one or more individual ones of the actuators to be actuated to divert power, of the power flow, being supplied to one or more of the rack-mounted computing systems by the power distribution element to be diverted to others of the rack-mounted computing systems being provided power, of the power flow, by the power distribution element such that an overall amount of power being supplied by the power distribution element does not exceed the level of power flow that causes the breaker to trip.

7. The power monitoring and loss prevention system of claim 6, further comprising:

a panel configured to direct power measurement data for the power distribution element to the one or more computing devices of the power monitoring and loss prevention system.

8. The power monitoring and loss prevention system of claim 7, wherein the panel is configured to re-direct power measurement data from power meters in a data center to the one or more computing devices of the power monitoring and loss prevention system.

9. The power monitoring and loss prevention system of claim 6, wherein the received power measurement data comprises power flow measurements performed at a rate of at least one measurement per every 500 milliseconds.

10. The power monitoring and loss prevention system of claim 6, further comprising:

an output cabinet configured to provide control signals to the actuators,
wherein the output cabinet comprises:
mounting brackets for mounting the output cabinet in an aisle associated with a power busway, a power distribution unit, or a power distribution cabinet controlled by the output cabinet; and
indicator lights configured to indicate which ones of the actuators have been actuated to divert power, wherein the indicator lights are visible from the aisle when the output cabinet is mounted in the aisle.

11. The power monitoring and loss prevention system of claim 6, further comprising:

an additional set of actuators configured to cause power being supplied to rack-mounted computing systems from an additional power distribution element to be diverted such that, for a given rack, a power load associated with the given rack is no longer provided from the additional power distribution element while other racks continue to be provided power from the additional power distribution element;

wherein the one or more computing devices are further configured to:
receive power measurement data for the additional power distribution element;
determine, whether a level of power flow for the additional power distribution element is greater than another threshold, wherein the other threshold is selected such that the threshold is below a level of power flow that causes a breaker for the additional power distribution element to trip; and cause one or more individual ones of the actuators of the additional set of actuators to be actuated to divert power being supplied to rack-mounted computing systems such that an overall amount of power being supplied by the additional power distribution element does not exceed the level of power flow that causes the breaker for the additional power distribution element to trip.

12. The power monitoring and loss prevention system of claim 11, wherein the one or more computing devices are mounted in an enclosure configured to mount in a data center comprising an electrical power distribution system that includes the power distribution element and the additional power distribution element, wherein the power distribution element and the additional power distribution element comprises one or more of:
a power busway;
a power distribution unit;
a remote power panel; or
a power distribution cabinet; and wherein the enclosure comprises a user interface configured to:
display configuration information for the power element and the additional power element; and
indicate a measured power flow one or more of a power busway, a power distribution unit; or a power distribution cabinet of the electrical power distribution system.

13. The power monitoring and loss prevention system of claim 12, wherein the one or more computing devices comprise:
a process logic controller (PLC) mounted in the enclosure.

14. The power monitoring and loss prevention system of claim 6 wherein the one or more computing devices are configured to:
determine, whether a level of power flow associated with a power distribution panel that supplies the power distribution element and an additional power distribution element is greater than a threshold for a power distribution panel breaker associated with the power distribution panel; and
cause one or more individual ones of the actuators to be actuated to divert power being supplied to one or more of the racks, such that an overall amount of power being supplied by the power distribution panel does not cause the power distribution panel breaker to trip.

15. The power monitoring and loss prevention system of claim 6 wherein the one or more computing devices are configured to:
cause an actuator associated with one of a power busway, a power distribution unit, or a power distribution cabinet to be actuated to divert power being supplied from the power busway, the power distribution unit, or the power distribution cabinet, such that an overall amount of power being supplied does not cause an upstream breaker to trip.

16. The power monitoring and loss prevention system of claim 6, wherein the threshold used for determining whether to actuate one of the actuators is based on a current flow rate and a duration of time for which power is provided at the current flow rate.

17. The power monitoring and loss prevention system of claim 6, wherein the one or more computing devices are further configured to:
receive an indication that a primary power system supplying the power to the rack mounted computing systems is to be transferred from supplying power from a utility power source to instead supplying power from a generator;
determine whether a current level of power flow being supplied by the primary power system from the utility power source exceeds a capacity of the generator to supply power; and
in response to determining the current level of power flow exceeds the capacity of the generator, cause one or more individual ones of the actuators to be actuated to divert power being supplied to one or more of the rack-mounted computing systems from the primary power system to be diverted such that an overall amount of power being supplied by the primary power system does not exceed the capacity of the generator.

18. One or more non-transitory, computer-readable storage media, storing program instructions that when executed on or across one or more computing devices cause the one or more computing devices to:
receive power measurement data for a power busway, a power distribution unit, or a power distribution cabinet;
determine, whether a level of power flow for the power busway, the power distribution unit, or the power distribution cabinet is greater than a threshold, wherein the threshold is selected such that the threshold is below a level of power flow that causes a breaker associated with the power busway, the power distribution unit, or the power distribution cabinet to trip; and
cause one or more actuators to be actuated to divert power being supplied to electrical loads from the power busway, the power distribution unit, or the power distribution cabinet to other electrical loads being supplied by the power busway, the power distribution unit, or the power distribution cabinet such that an overall amount of power being supplied by the power busway, the power distribution unit, or the power distribution cabinet does not exceed the level of power flow that causes the breaker to trip.

19. The one or more non-transitory, computer-readable storage media of claim 18, wherein the program instructions when executed on or across the one or more computing devices, cause the one or more computing devices to:
issue a cautionary alarm in response to the power flow for the power busway, the power distribution unit, or the power distribution cabinet exceeding another threshold, wherein the other threshold is triggered at a lower level of power flow than the threshold associated with diverting power.

20. The one or more non-transitory, computer-readable storage media of claim 18, wherein to determine whether the power flow for the power busway, the power distribution unit, or the power distribution cabinet is greater than the threshold, the program instructions cause the one or more computing devices to:
determine an amount of current that has been provided over a period of time, wherein the threshold is based on a current flow rate and a duration of time for which power is provided at the current flow rate.

* * * * *